(12) United States Patent
Song et al.

(10) Patent No.: US 11,749,948 B2
(45) Date of Patent: *Sep. 5, 2023

(54) BACKPLANE CONNECTOR

(71) Applicant: DONGGUAN LUXSHARE TECHNOLOGIES CO., LTD, Dongguan (CN)

(72) Inventors: Tao Song, Dongguan (CN); Kun Liu, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 210 days.

This patent is subject to a terminal disclaimer.

(21) Appl. No.: 17/340,877

(22) Filed: Jun. 7, 2021

(65) Prior Publication Data

US 2021/0399487 A1 Dec. 23, 2021

(30) Foreign Application Priority Data

Jun. 19, 2020 (CN) .......................... 202010567796.4
Jan. 12, 2021 (CN) .......................... 202110037249.X

(51) Int. Cl.
*H01R 13/648* (2006.01)
*H01R 13/6471* (2011.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC .. H01R 12/585; H01R 12/716; H01R 12/724; H01R 12/722; H01R 12/712;
(Continued)

(56) References Cited

U.S. PATENT DOCUMENTS 4,601,527 A 7/1986 Lemke
5,664,968 A 9/1997 Mickievicz
(Continued)

FOREIGN PATENT DOCUMENTS

CN 1244959 A 2/2000
CN 2513252 Y 9/2002
(Continued)

OTHER PUBLICATIONS

The Chinese Office Action and Search Report for Chinese Application No. 202011577310.1, dated Nov. 23, 2021.
(Continued)

*Primary Examiner* — Khiem M Nguyen
(74) *Attorney, Agent, or Firm* — Birch, Stewart, Kolasch & Birch, LLP

(57) ABSTRACT

A backplane connector includes a number of first conductive terminals, an insulating bracket, a first metal shield and a second metal shield. The first conductive terminal includes a first mating portion, a first tail portion and a first connection portion. The first conductive terminals include first differential signal terminals, a first ground terminal and a second ground terminal. The first mating portion, the first connection portion and the first tail portion extend along a mating direction so that the structural design of the conductive terminal is simplified. The first metal shield, the second metal shield, the first mating portion of the first grounding terminal and the first mating portion of the second grounding terminal are enclosed to form a shielding space. The first mating portions of the first differential signal terminals are located in the shielding space.

12 Claims, 25 Drawing Sheets

(51) Int. Cl.

| | | |
|---|---|---|
| H01R 13/40 | (2006.01) | |
| H01R 13/6587 | (2011.01) | |
| H01R 13/6591 | (2011.01) | |
| H01R 13/514 | (2006.01) | |
| H01R 13/518 | (2006.01) | |
| H01R 12/72 | (2011.01) | |
| H01R 13/6586 | (2011.01) | |
| H01R 12/58 | (2011.01) | |
| H05K 1/11 | (2006.01) | |
| H01R 13/6588 | (2011.01) | |
| H01R 13/6583 | (2011.01) | |
| H01R 13/6585 | (2011.01) | |
| H01R 13/6582 | (2011.01) | |
| H01R 43/24 | (2006.01) | |
| H01R 12/71 | (2011.01) | |
| H01R 13/20 | (2006.01) | |
| H01R 13/504 | (2006.01) | |
| H01R 13/6461 | (2011.01) | |
| H01R 13/6584 | (2011.01) | |
| H05K 3/30 | (2006.01) | |
| H01R 13/02 | (2006.01) | |
| H05K 3/34 | (2006.01) | |
| H01R 13/6474 | (2011.01) | |
| H01R 13/502 | (2006.01) | |
| H01R 13/46 | (2006.01) | |
| H01R 13/646 | (2011.01) | |
| H01R 13/6473 | (2011.01) | |
| H01R 13/6581 | (2011.01) | |

(52) U.S. Cl.
CPC .......... *H01R 12/724* (2013.01); *H01R 13/02* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H05K 3/306* (2013.01); *H05K 3/3447* (2013.01); *H01R 12/71* (2013.01); *H01R 12/712* (2013.01); *H01R 12/722* (2013.01); *H01R 13/46* (2013.01); *H01R 13/502* (2013.01); *H01R 13/646* (2013.01); *H01R 13/6473* (2013.01); *H01R 13/6474* (2013.01); *H01R 13/6581* (2013.01); *H05K 2201/09236* (2013.01); *H05K 2201/1078* (2013.01); *H05K 2201/10189* (2013.01); *H05K 2201/10371* (2013.01); *H05K 2201/10871* (2013.01)

(58) Field of Classification Search
CPC ................ H01R 12/71; H01R 13/6471; H01R 13/6474; H01R 13/6591; H01R 13/6588; H01R 13/6587; H01R 13/6586; H01R 13/6585; H01R 43/24; H05K 1/115; H05K 3/306; H05K 3/3447; H05K 2201/09236; H05K 2201/10189; H05K 2201/10371; H05K 2201/1078; H05K 2201/10871
USPC .................................................. 439/607.05
See application file for complete search history.

(56) References Cited

U.S. PATENT DOCUMENTS

| | | |
|---|---|---|
| 9,350,126 B2 | 5/2016 | Little et al. |
| 9,548,570 B2 | 1/2017 | Laurx et al. |
| 2004/0043658 A1 | 3/2004 | Ko |
| 2004/0229510 A1 | 11/2004 | Lloyd et al. |
| 2007/0155239 A1 | 7/2007 | Nakada |
| 2008/0014798 A1 | 1/2008 | Pan |
| 2013/0203273 A1 | 8/2013 | Rathburn |
| 2014/0051295 A1 | 2/2014 | Westman et al. |
| 2014/0248796 A1 | 9/2014 | Pan |
| 2014/0295705 A1 | 10/2014 | Lee et al. |
| 2015/0194771 A1 | 7/2015 | Pan |
| 2015/0303618 A1 | 10/2015 | Lee et al. |
| 2015/0318642 A1 | 11/2015 | Lee et al. |
| 2016/0093985 A1 | 3/2016 | Zhang et al. |
| 2016/0322760 A1 | 11/2016 | Long et al. |
| 2018/0166828 A1 | 6/2018 | Gailus |
| 2019/0044284 A1 | 2/2019 | Dunham |

FOREIGN PATENT DOCUMENTS

| | | |
|---|---|---|
| CN | 2571026 Y | 9/2003 |
| CN | 1491465 A | 4/2004 |
| CN | 1592990 A | 3/2005 |
| CN | 2682605 Y | 3/2005 |
| CN | 101159354 A | 4/2008 |
| CN | 201142392 Y | 10/2008 |
| CN | 101330172 A | 12/2008 |
| CN | 101527409 A | 9/2009 |
| CN | 101542640 A | 9/2009 |
| CN | 101728667 A | 6/2010 |
| CN | 101459299 B | 11/2010 |
| CN | 102088148 A | 6/2011 |
| CN | 102290653 A | 12/2011 |
| CN | 102468562 A | 5/2012 |
| CN | 202395246 U | 8/2012 |
| CN | 102694308 A | 9/2012 |
| CN | 102969621 A | 3/2013 |
| CN | 103151650 A | 6/2013 |
| CN | 103247918 A | 8/2013 |
| CN | 103296546 A | 9/2013 |
| CN | 103311746 A | 9/2013 |
| CN | 203288874 U | 11/2013 |
| CN | 203589266 U | 5/2014 |
| CN | 103928795 A | 7/2014 |
| CN | 103988371 A | 8/2014 |
| CN | 104037551 A | 9/2014 |
| CN | 104241975 A | 12/2014 |
| CN | 104396095 A | 3/2015 |
| CN | 104505678 A | 4/2015 |
| CN | 104577406 A | 4/2015 |
| CN | 204304028 U | 4/2015 |
| CN | 104779487 A | 7/2015 |
| CN | 104810657 A | 7/2015 |
| CN | 105024230 A | 11/2015 |
| CN | 105470679 A | 4/2016 |
| CN | 105470732 A | 4/2016 |
| CN | 105470736 A | 4/2016 |
| CN | 105612664 A | 5/2016 |
| CN | 105703159 A | 6/2016 |
| CN | 105742854 A | 7/2016 |
| CN | 105958245 A | 9/2016 |
| CN | 106207569 A | 12/2016 |
| CN | 205846279 U | 12/2016 |
| CN | 107104329 A | 8/2017 |
| CN | 104009303 B | 1/2018 |
| CN | 107565279 A | 1/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |
| CN | 109599724 A | 4/2019 |
| CN | 109659726 A | 4/2019 |
| CN | 109841981 A | 6/2019 |
| CN | 109950721 A | 6/2019 |

(56) References Cited

FOREIGN PATENT DOCUMENTS

| | | | |
|---|---|---|---|
| CN | 208955335 U | 6/2019 |
| CN | 109994892 A | 7/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| CN | 111682369 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |
| TW | I528659 B | 4/2016 |
| TW | I545845 B | 8/2016 |
| TW | M537321 U | 2/2017 |
| TW | 201733225 A | 9/2017 |
| TW | I600231 B | 9/2017 |
| TW | 201810825 A | 3/2018 |
| TW | I623154 B | 5/2018 |
| TW | 201834333 A | 9/2018 |
| TW | 201841440 A | 11/2018 |
| TW | I648925 B | 1/2019 |
| TW | M585436 U | 10/2019 |
| TW | 201943158 A | 11/2019 |
| TW | M591270 U | 2/2020 |
| TW | M593091 U | 4/2020 |
| TW | 202046584 A | 12/2020 |
| WO | WO 2016/168820 A1 | 10/2016 |
| WO | WO 2017/106266 A1 | 6/2017 |

OTHER PUBLICATIONS

The Chinese Office Action and Search Report for Chinese Application No. 202110035372.8, dated Jan. 6, 2022.
The Chinese Office Action and Search Report for Chinese Application No. 202011577786.5, dated Feb. 16, 2022.
The Taiwanese Office Action and Search Report for Taiwanese Application No. 110104064, dated Dec. 9, 2021.
The Taiwanese Office Action and Search Report for Taiwanese Application No. 110104068, dated Jan. 26, 2022.
Attached is the Taiwanese Office Action and Search Report for Taiwanese Application No. 110117853, dated Feb. 9, 2022.
The Taiwanese Office Action and Search Report for Taiwanese Application No. 110144691, dated Jan. 12, 2023.
The Taiwanese Office Action and Search Report for Taiwanese Application No. 110104066, dated Feb. 2, 2023.
Office Action issued in Chinese Patent Application No. 202010709127.6, dated Mar. 26, 2021.
Office Action issued in Chinese Patent Application No. 202010709180.6, dated Mar. 30, 2021.
Office Action issued in Chinese Patent Application No. 202010710402.6, dated Mar. 3, 2021.
Office Action issued in Chinese Patent Application No. 202010710463.2, dated Mar. 25, 2021.
Office Action issued in Chinese Patent Application No. 202010931721.X, dated Mar. 25, 2021.
Office Action issued in Taiwanese Patent Application No. 109128295, dated Apr. 14, 2021.
Office Action issued in Taiwanese Patent Application No. 109129938, dated Apr. 15, 2021.
Attached is the Taiwanese Office Action and Search Report for Taiwanese Application No. 109128295, dated, Apr. 14, 2021.
Attached is the Taiwanese Office Action and Search Report for Taiwanese Application No. 109128294, dated Jun. 21, 2021.
Attached is the Taiwanese Office Action and Search Report for Taiwanese Application No. 109129936, dated Aug. 9, 2021.

BACKPLANE CONNECTOR

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202110037249.X, filed on Jan. 12, 2021 and titled "BACKPLANE CONNECTOR", the entire content of which is incorporated herein by reference.

TECHNICAL FIELD

The present disclosure relates to a backplane connector which belongs to a technical field of connectors.

BACKGROUND

Existing backplane connector assemblies usually include a male connector and a female connector. The male connector usually includes a male housing and a plurality of male terminal modules mounted on the male housing. Each male terminal module includes an insulating bracket, a plurality of male conductive terminals insert-molded with the insulating bracket, and a first metal shield disposed on at least one side of the insulating bracket. The male conductive terminal usually includes a first mating portion and a first mounting portion perpendicular to the first mating portion.

The female connector usually includes a female housing and a plurality of female terminal modules mounted on the female housing. Each female terminal module includes an insulating bracket, a plurality of female conductive terminals insert-molded with the insulating bracket, and a second metal shield disposed on at least one side of the insulating bracket. The female conductive terminal usually includes a second mating portion and a second mounting portion perpendicular to the second mating portion.

However, the design structure of the conductive terminals of the existing backplane connectors is relatively complicated.

SUMMARY

An object of the present disclosure is to provide a backplane connector with simple structure of conductive terminals.

In order to achieve the above object, the present disclosure adopts the following technical solution: a backplane connector, comprising: a plurality of first terminal modules, each first terminal module comprising: a plurality of first conductive terminals, each first conductive terminal comprising a first mating portion, a first tail portion and a first connection portion connecting the first mating portion and the first tail portion; an insulating bracket fixed on the first connection portions of the first conductive terminals; a first metal shield comprising a first extension portion; and a second metal shield comprising a second extension portion; wherein the first conductive terminals comprise first differential signal terminals, a first ground terminal and a second ground terminal, and wherein the first differential signal terminals are located between the first ground terminal and the second ground terminal; wherein the first mating portion, the first connection portion and the first tail portion extend along a mating direction; and wherein the first extension portion, the second extension portion, the first mating portion of the first ground terminal and the first mating portion of the second ground terminal are enclosed to form a shielding space in which the first mating portions of the first differential signal terminals are located.

Compared with the prior art, the first mating portion, the first connection portion and the first tail portion of the first conductive terminal of the present disclosure extend along the mating direction, thereby simplifying the structural design of the first conductive terminal. In addition, by providing the shielding spaces, the shielding effect and the quality of signal transmission of the present disclosure are improved.

DETAILED DESCRIPTION

Figure 1:
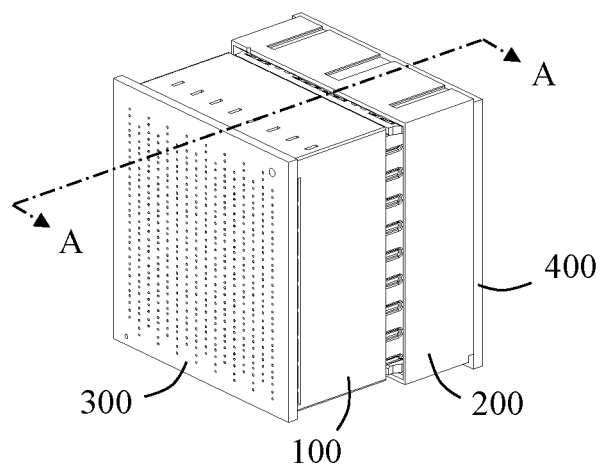
FIG. 1 is a perspective view of a backplane connector assembly in accordance with an embodiment of the disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
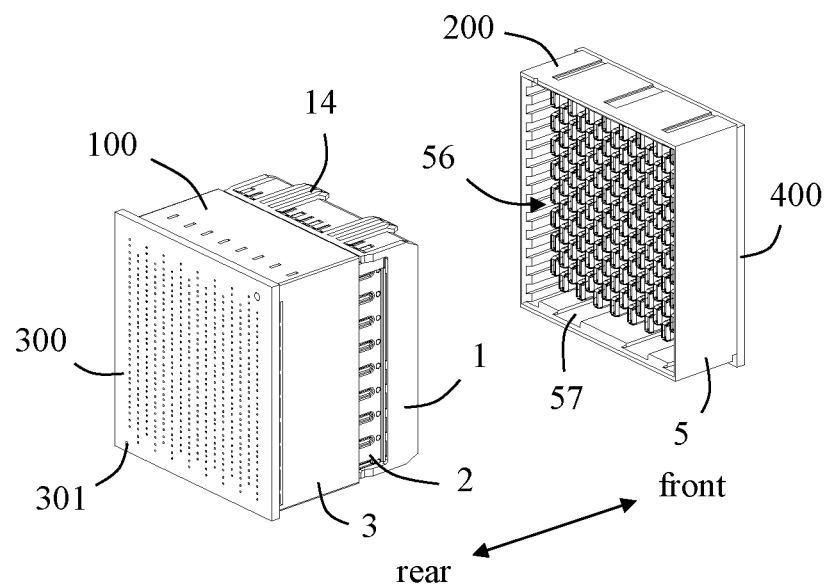
FIG. 2 is a partial perspective exploded view of FIG. 1, in which a first backplane connector and a second backplane connector are separated from each other.

Referring to FIGS. 1 and 2, the illustrated embodiment of the present disclosure discloses a backplane connector assembly. The backplane connector assembly includes a first backplane connector 100, a second backplane connector 200 for mating with the first backplane connector 100, a first circuit board 300 on which the first backplane connector 100 is mounted, and a second circuit board 400 on which the second backplane connector 200 is mounted. In the illustrated embodiment of the present disclosure, the first backplane connector 100 and the second backplane connector 200 are mated with each other along a mating direction to achieve signal transmission. In the illustrated embodiment of the present disclosure, the mating direction is a front-rear direction. The first circuit board 300 is parallel to the second circuit board 400.

Figure 3:
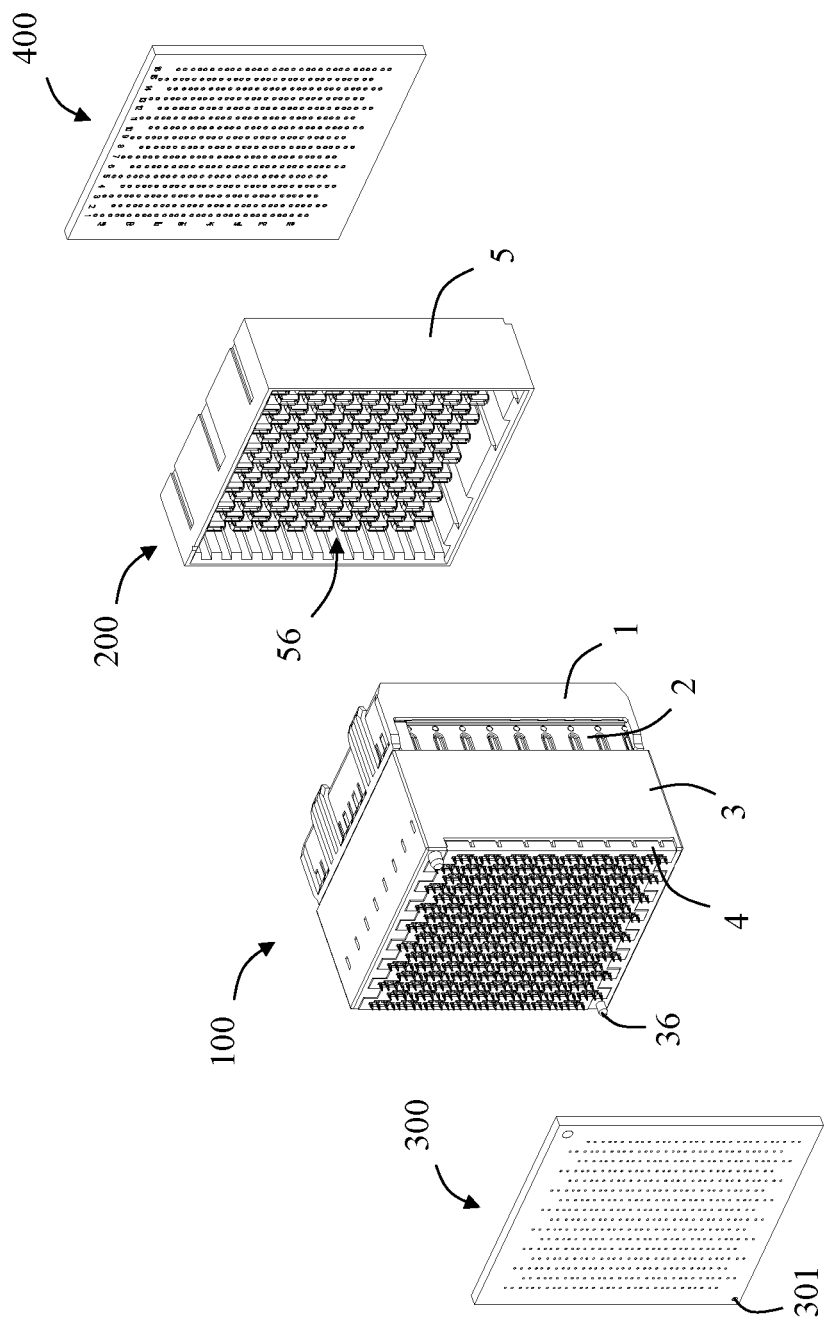
FIG. 3 is a further perspective exploded view of FIG. 2, in which the first backplane connector and a first circuit board are separated from each other, and the second backplane connector and a second circuit board are separated from each other.
Figure 4:
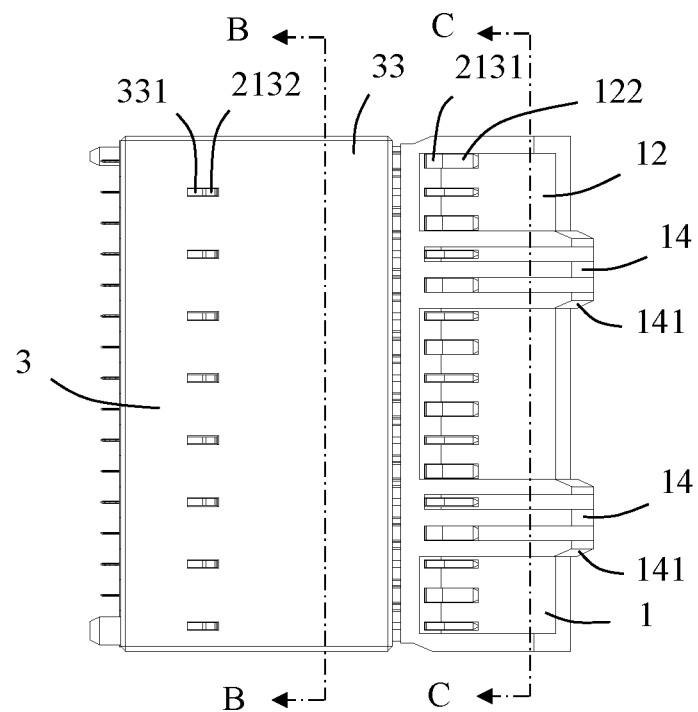
FIG. 4 is a top view of the first backplane connector in FIG. 3.
Figure 5:
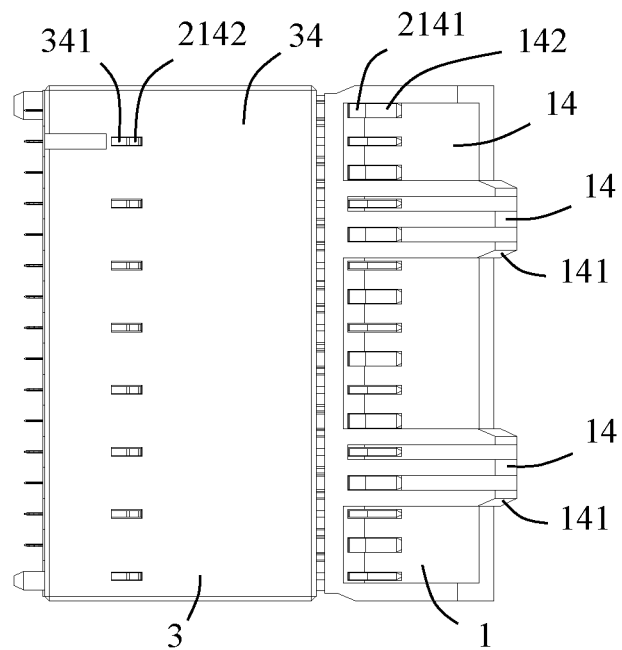
FIG. 5 is a bottom view of the first backplane connector in FIG. 3.

Referring to FIGS. 2 and 3, the first backplane connector 100 includes a first housing 1, a mounting housing 3, a plurality of first terminal modules 2 assembled to the first housing 1 and the mounting housing 3, and a first mounting block 4 held at a rear end of the plurality of first terminal modules 2.

Referring to FIGS. 4 to 10, the first housing 1 is made of insulating material. The first housing 1 includes a first body portion 11, a first wall portion 12 extending rearwardly from one end (for example, an upper end) of the first body portion 11, and a second wall portion 13 extending rearwardly from the other end (for example, a lower end) of the first body portion 11. The first body portion 11 has a mating surface 111 and a plurality of first terminal receiving grooves 112 extending through the mating surface 111. In the illustrated embodiment of the present disclosure, the first terminal receiving grooves 112 are disposed in multiple rows along a vertical direction. Two adjacent rows of first terminal receiving grooves 112 are staggered in a left-right direction. That is, the first terminal receiving grooves 112 at corresponding positions in two adjacent rows of the first terminal receiving grooves 112 are not in alignment in the vertical direction.

The first wall portion 12 includes a plurality of first slots 121 and a plurality of first locking grooves 122 in communication with the first slots 121. The second wall portion 13 includes a plurality of second slots 131 and a plurality of second locking grooves 132 in communication with the second slots 131. The first locking grooves 122 extend upwardly through the first wall portion 12. The second locking grooves 132 extend downwardly through the second wall portion 13. The first locking grooves 122 and the second locking grooves 132 are adapted to lock with a front end of the first terminal module 2 in order to prevent the first terminal module 2 from being separated from the first housing 1. The first slot 121 and the second slot 131 aligned with each other in the vertical direction form an installation slot 120 for receiving the corresponding first terminal module 2.

Figure 8:
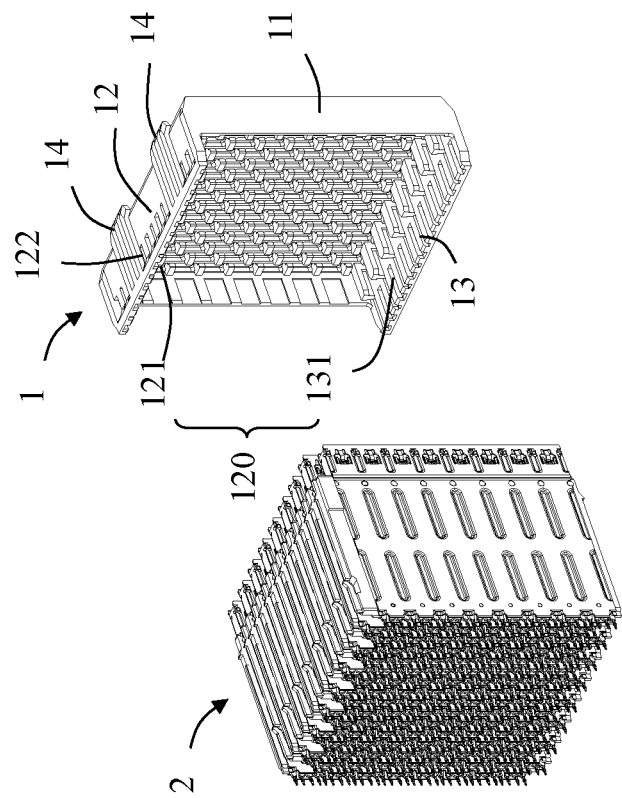
FIG. 8 is a further perspective exploded view after removing a first mounting block in FIG. 6.
Figure 8:
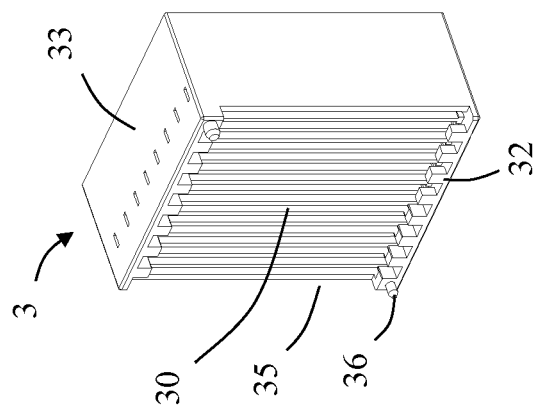
Figure 9:
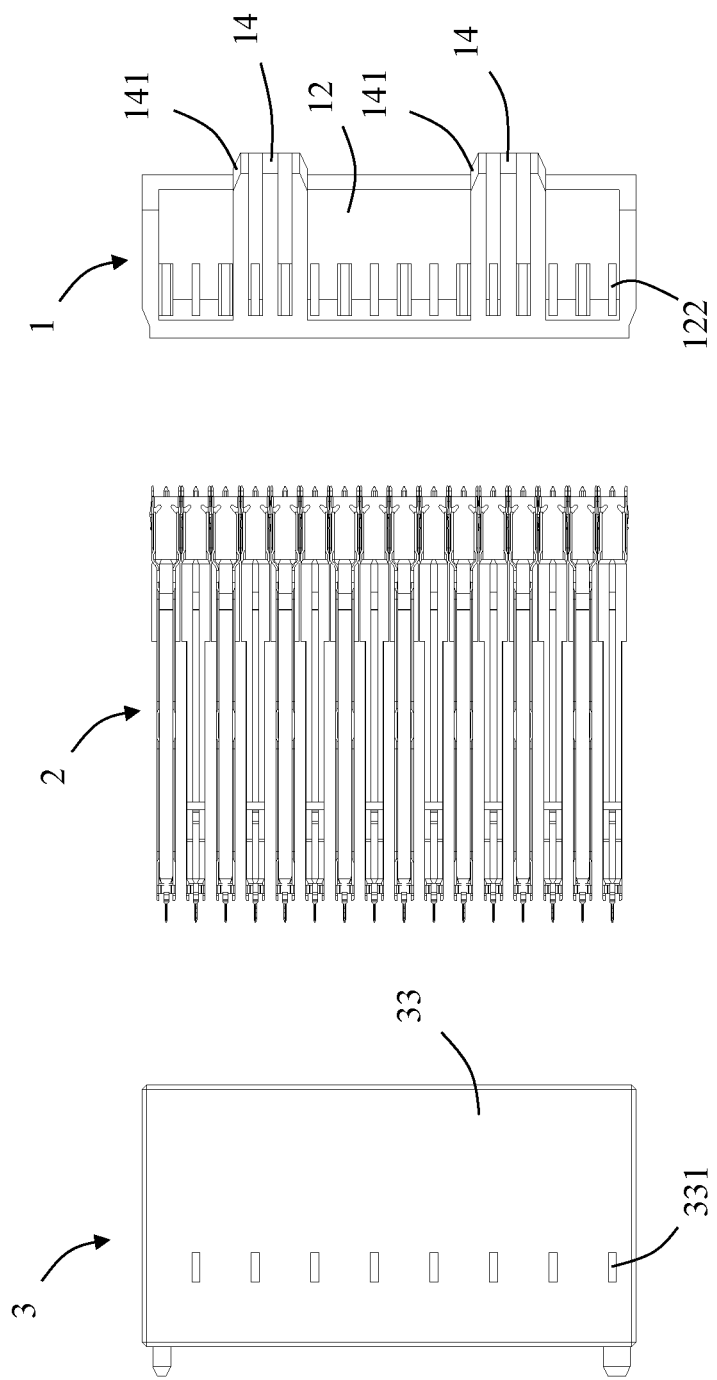
FIG. 9 is a top view of FIG. 8.
Figure 10:
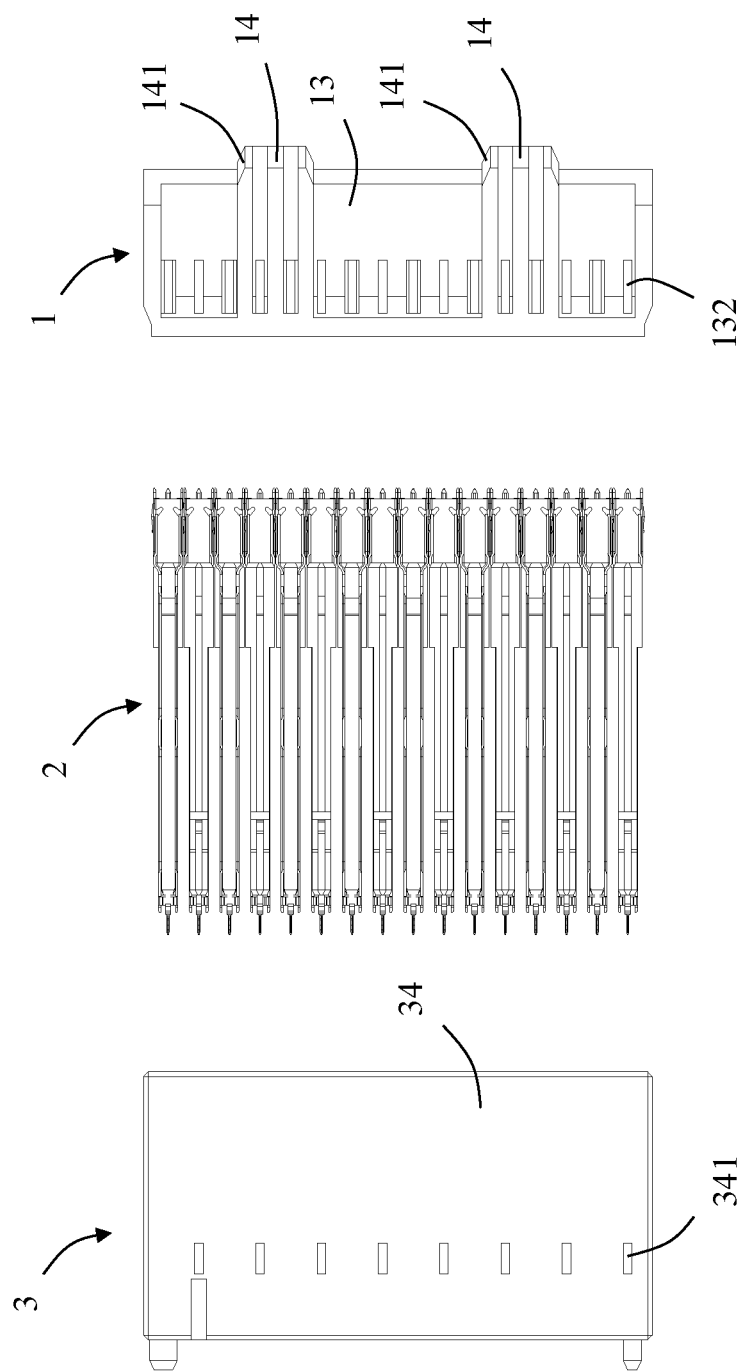
FIG. 10 is a bottom view of FIG. 8.
Figure 11:
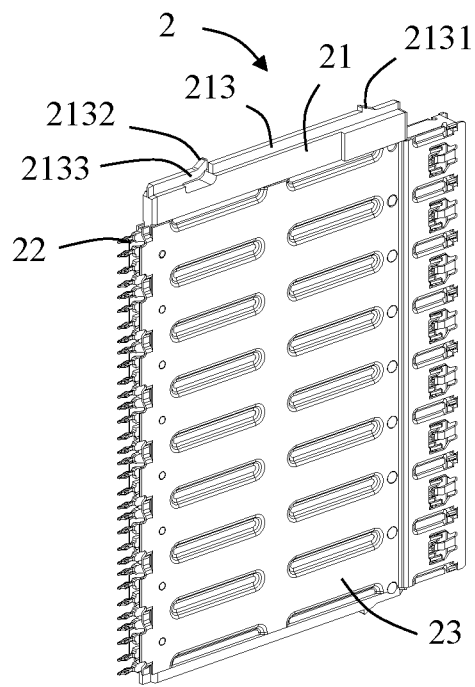
FIG. 11 is a perspective schematic view of a first terminal module.
Figure 12:
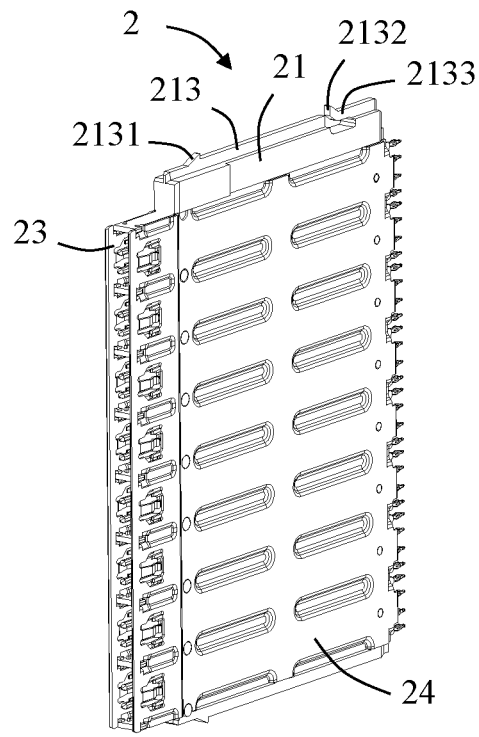
FIG. 12 is a perspective schematic view of FIG. 11 from another angle.

In addition, referring to FIGS. 8 to 10, the first housing 1 further includes a plurality of positioning protrusions 14 extending forwardly from the first wall portion 12 and the second wall portion 13 and protruding beyond the matting surface 111. Each positioning protrusion 14 includes a guiding inclined surface 141 at an end of the positioning protrusion 14 in order to facilitate insertion of the first backplane connector 100 into the second backplane connector 200.

In the illustrated embodiment of the present disclosure, the first housing 1 and the mounting housing 3 are disposed in the front-rear direction. The first housing 1 is located at a front end of the first backplane connector 100, and the mounting housing 3 is located at a rear end of the first backplane connector 100. The first housing 1 and the mounting housing 3 are disposed separately, but they are close to each other after assembly so as to improve the structural strength.

Figure 7:
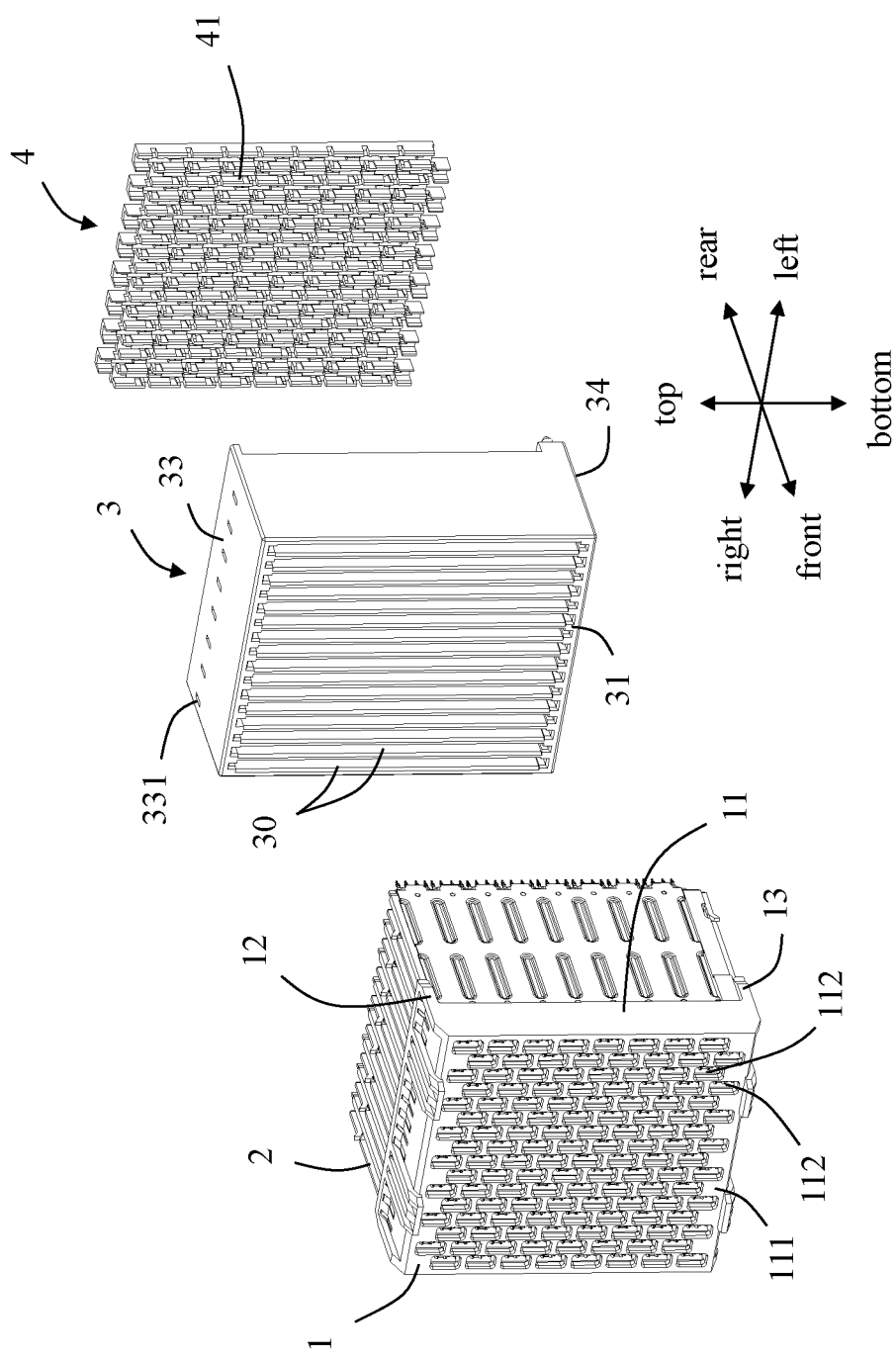
FIG. 7 is a partially exploded perspective view of FIG. 6 from another angle.

Referring to FIGS. 7 and 8, specifically, the mounting housing 3 is made of insulating material and has a substantially cuboid shape. The mounting housing 3 includes a first end surface 31 close to the first housing 1, a first mounting surface 32 opposite to the first end surface 31, and a plurality of receiving slots 30 extending through the first end surface 31 and the first mounting surface 32 in the front-rear direction. The receiving slots 30 and the corresponding installation slots 120 are aligned in the front-rear direction in order to jointly receive the corresponding first terminal modules 2.

The mounting housing 3 further includes a third wall portion 33 and a fourth wall portion 34 opposite to the third wall portion 33. The third wall portion 33 corresponds to the first wall portion 12 along the front-rear direction. The fourth wall portion 34 corresponds to the second wall portion 13 along the front-rear direction. The third wall portion 33 includes a plurality of third locking grooves 331 in communication with the receiving slots 30 (referring to FIGS. 4 and 7). The fourth wall portion 34 includes a plurality of fourth locking grooves 341 in communication with the receiving slots 30 (referring to FIG. 5). The third locking grooves 331 extend upwardly through the third wall portion 33. The fourth locking grooves 341 extend downwardly through the fourth wall portion 34. The third locking grooves 331 and the fourth locking grooves 341 are adapted to lock with a rear end of the first terminal module 2 in order to prevent the first terminal module 2 from being separated from the mounting housing 3.

Figure 6:
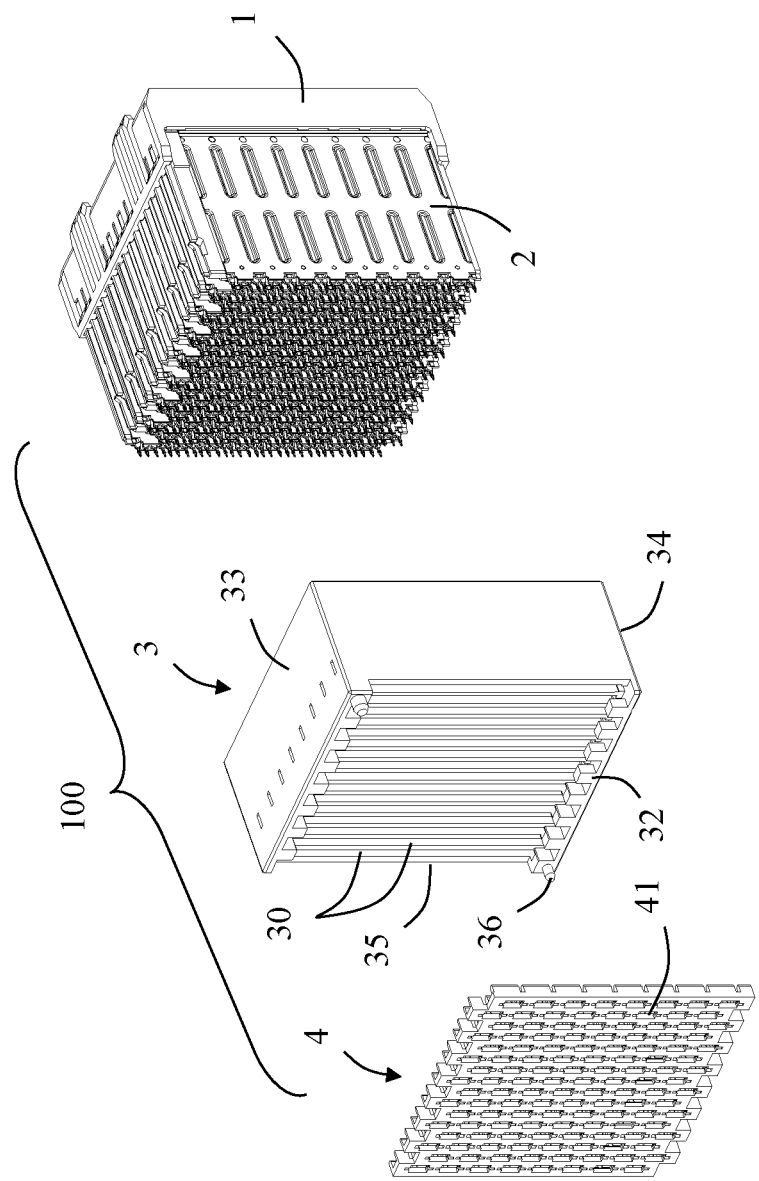
FIG. 6 is a partial perspective exploded view of the first backplane connector in FIG. 3.

Referring to FIGS. 3 and 6, the mounting housing 3 also includes a first mounting space 35 recessed from the first mounting surface 32 toward the first end surface 31, and a plurality of first positioning posts 36 protruding backwardly from the first mounting surface 32. The first mounting space 35 is adapted to install the first mounting block 4. The first positioning posts 36 are adapted for being inserted into positioning holes 301 of the first circuit board 300 to achieve installation and positioning.

Referring to FIGS. 11 to 15, the first terminal module 2 includes an insulating bracket 21, a plurality of first conductive terminals 22 fixed to the insulating bracket 21, a first metal shield 23 fixed on one side of the insulating bracket 21, and a second metal shield 24 fixed on the other side of the insulating bracket 21.

Figure 14:
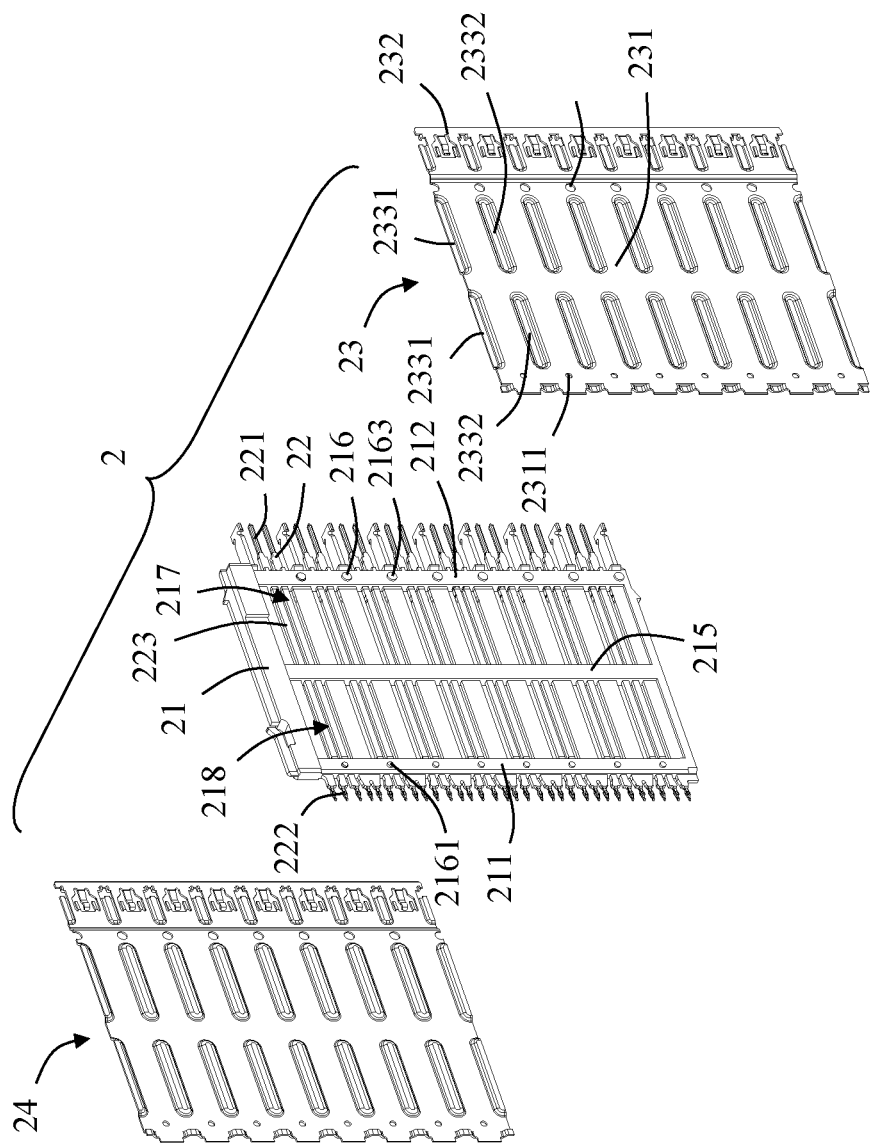
FIG. 14 is a partially exploded perspective view of FIG. 11.
Figure 15:
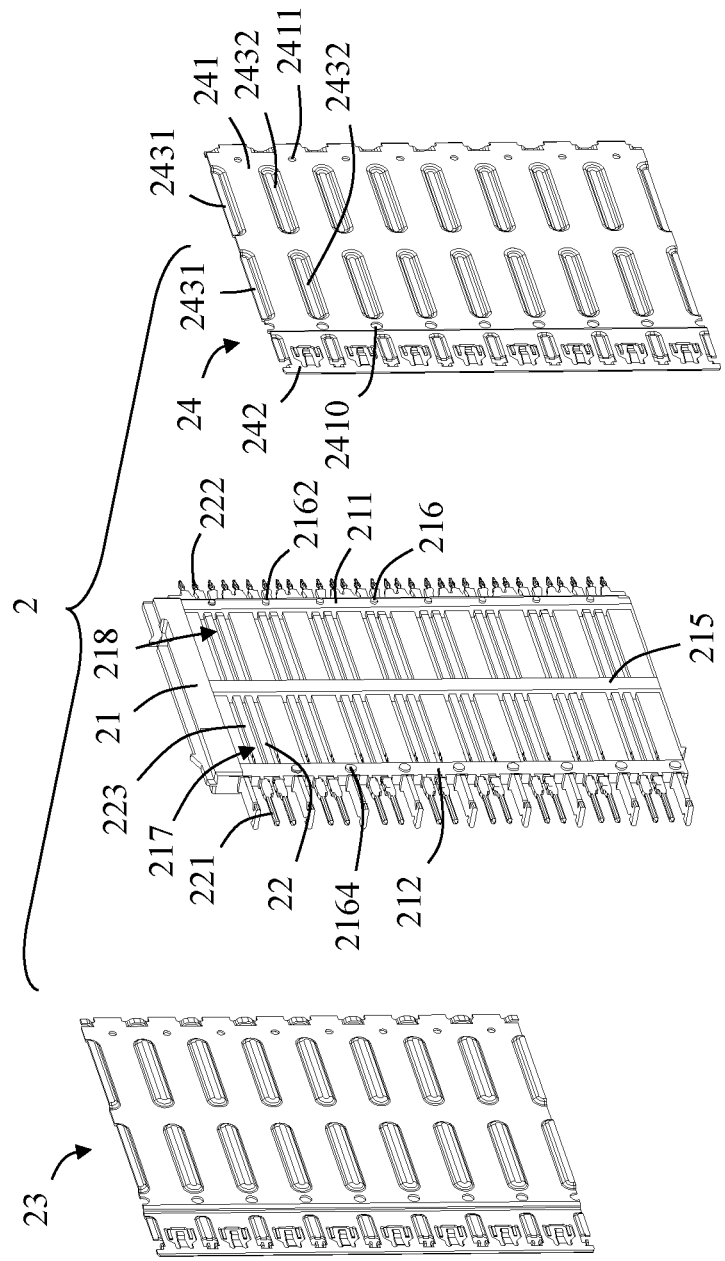
FIG. 15 is a partially exploded perspective view of FIG. 14 from another angle.
Figure 18:
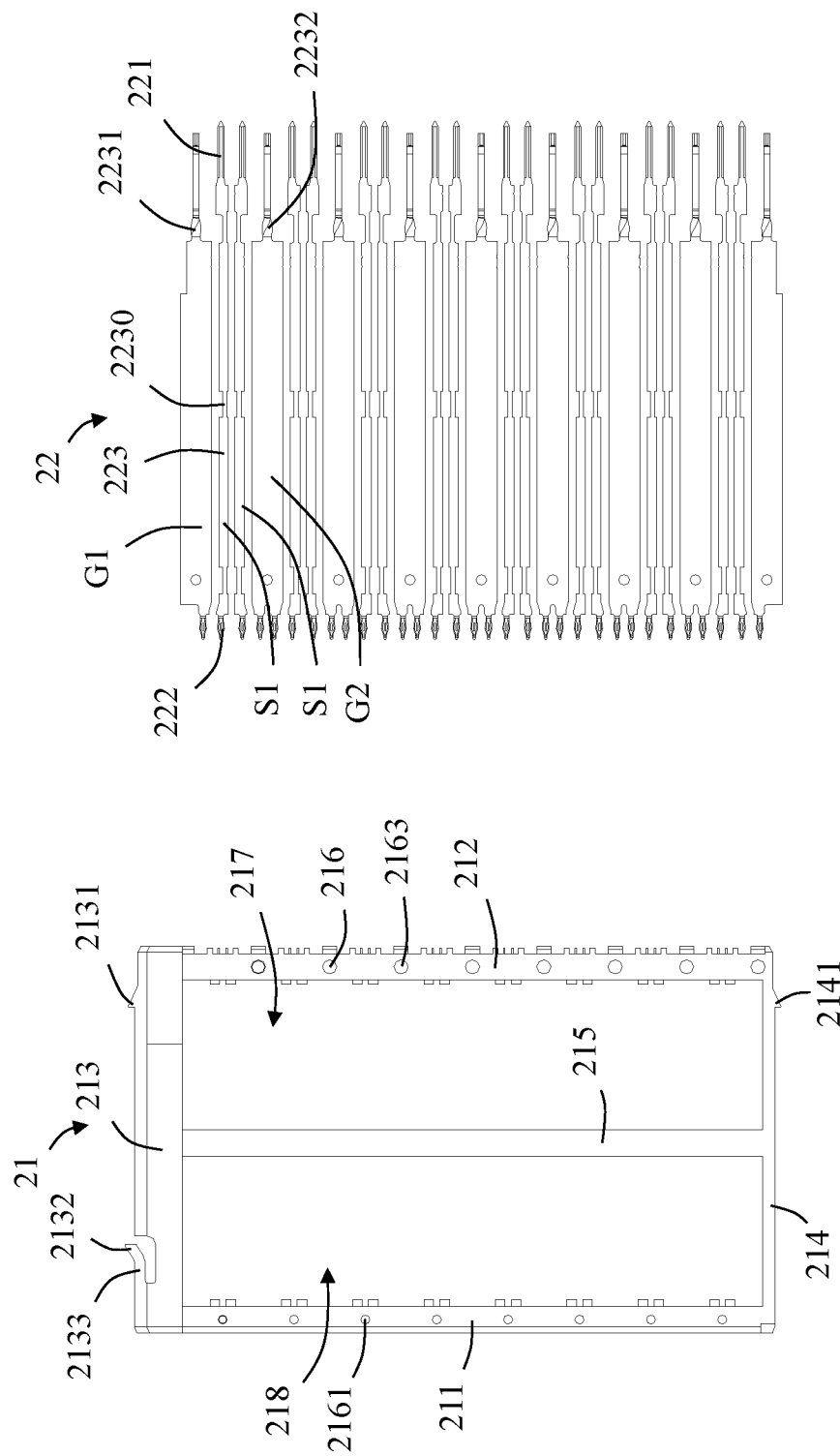
FIG. 18 is a front view of an insulating bracket in FIG. 14 when the first conductive terminals are separated.

Referring to FIGS. 14, 15 and 18, the insulating bracket 21 is roughly frame-shaped. The insulating bracket 21 includes a first rear wall 211, a first front wall 212 opposite to the first rear wall 211, a first top wall 213 connecting one end of the first rear wall 211 and one end of the first front wall 212, a first bottom wall 214 connecting the other end of the first rear wall 211 and the other end of the first front wall 212, and a reinforcing wall 215 connecting the first top wall 213 and the first bottom wall 214. The reinforcing wall 215 can enhance the structural strength of the frame. In the illustrated embodiment of the present disclosure, the reinforcing wall 215 is located between the first front wall 212 and the first rear wall 211 in the front-rear direction. The reinforcing wall 215, the first front wall 212 and the first rear wall 211 are parallel to each other. The insulating bracket 21 includes a first hollow portion 217 located between the first front wall 212 and the reinforcing wall 215, and a second hollow portion 218 located between the reinforcing wall 215 and the first rear wall 211.

Figure 13:
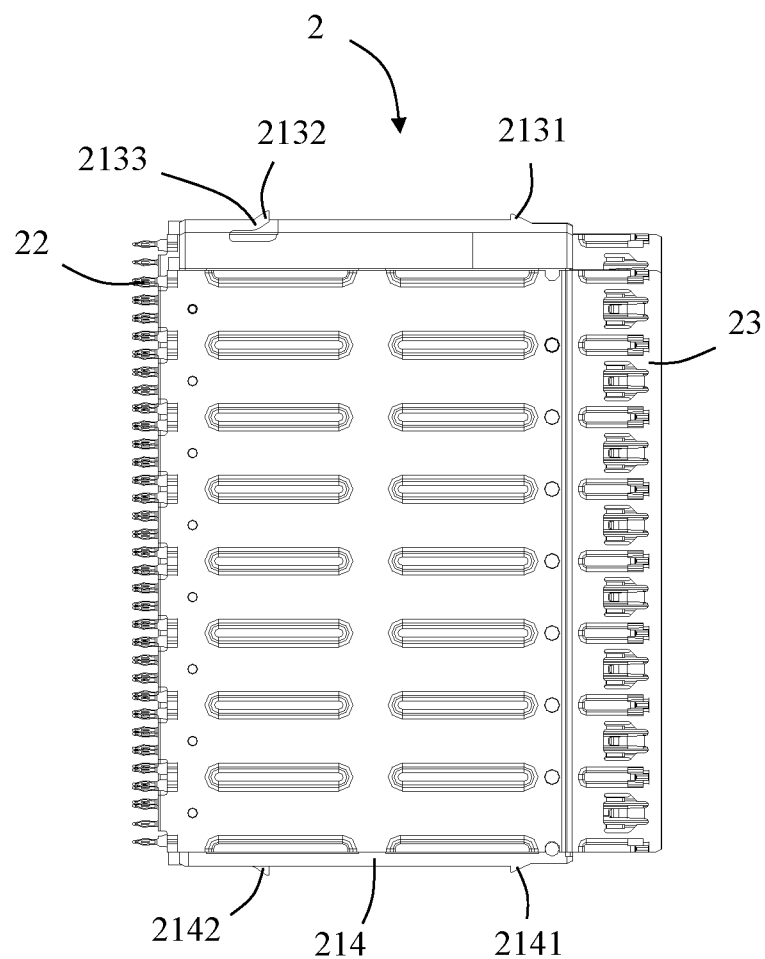
FIG. 13 is a front view of FIG. 11.

The first top wall 213 includes a first locking protrusion 2131 locked in the first locking groove 122 and a third locking protrusion 2132 locked in the third locking groove 331. The first bottom wall 214 includes a second locking protrusion 2141 locked in the second locking groove 132. In the illustrated embodiment of the present disclosure, the first locking protrusion 2131 and the second locking protrusion 2141 are both non-elastic protrusions. The third locking protrusion 2132 is an elastic protrusion. In the illustrated embodiment of the present disclosure, the first top wall 213 includes a locking elastic arm 2133. The third locking protrusion 2132 is disposed on the locking elastic arm 2133. Specifically, the locking elastic arm 2133 is of a cantilever configuration extending along a rear-to-front direction. The third locking protrusion 2132 is disposed on a free end of the locking elastic arm 2133. Inclination directions of the first locking protrusion 2131 and the third locking protrusion 2132 are opposite to each other. For example, the first locking protrusion 2131 is inclined to the left, and the third locking protrusion 2132 is inclined to the right. Referring to FIG. 13, in the illustrated embodiment of the present disclosure, the first bottom wall 214 of some first terminal modules 2 further includes a fourth locking protrusion 2142 which is locked in the fourth locking groove 341.

Referring to FIGS. 14 and 15, the insulating bracket 21 further includes a plurality of posts 216 for fixing and positioning the first metal shield 23 and the second metal shield 24. In the illustrated embodiment of the present disclosure, the posts 216 are substantially cylindrical. In the illustrated embodiment of the present disclosure, the posts 216 include a plurality of first posts 2161 disposed on one side of the first rear wall 211, a plurality of second posts 2162 disposed on the other side of the first rear wall 211, a plurality of third posts 2163 disposed on one side of the first front wall 212, and a plurality of fourth posts 2164 disposed on the other side of the first front wall 212. The first posts 2161 and the third posts 2163 are located on a same side of the insulating bracket 21. The second posts 2162 and the fourth posts 2164 are located on a same side of the insulating bracket 21. The first metal shield 23 and the second metal shield 24 are respectively located on opposite sides of the insulating bracket 21.

Referring to FIGS. 14, 15 and 18, each group of first conductive terminals 22 includes a first mating portion 221, a first tail portion 222, and a first connection portion 223 connecting the first mating portion 221 and the first tail portion 222. The first connection portion 223 is fixed to the insulating bracket 21 and partially exposed in the first hollow portion 217 and the second hollow portion 218 in order to adjust impedance. The first mating portion 221 extends forwardly to protrude beyond the insulating bracket 21 for mating with the second backplane connector 200. The first tail portion 222 extends backwardly to protrude beyond the insulating bracket 21 for being mounted on the first circuit board 300. In an embodiment of the present disclosure, the first mounting block 4 is made of electroplated plastic or conductive plastic so as to improve the shielding effect. As shown in FIGS. 3 and 6, the first mounting block 4 includes a plurality of positioning holes 41. The first tail portions 222 extend through the positioning holes 41 to be mounted on the first circuit board 300. This arrangement is beneficial to ensure the distance between the first tail portions 222, thereby facilitating the installation of the first tail portions 222 to the first circuit board 300. In the illustrated embodiment of the present disclosure, the first conductive terminal 22 has a straight strip shape and extends along the front-rear direction. The first conductive terminal 22 with this structure is relatively simple in design and easy to manufacture.

Each group of first conductive terminals 22 include a plurality of first ground terminals G1, a plurality of second ground terminals G2 and a plurality of first signal terminals S1. In the illustrated embodiment of the present disclosure, two adjacent first signal terminals S1 form a pair of first differential signal terminals. Each pair of first differential signal terminals are located between one first ground terminal G1 and one second ground terminal G2. That is, each group of first conductive terminals 22 are arranged in a manner of G1-S1-S1-G2. This arrangement helps to improve the quality of signal transmission. The first differential signal terminals are narrow-side coupling or wide-side coupling. A width of either of the first ground terminal G1 and the second ground terminal G2 (for example, a distance in the left-right direction) is greater than a width of each first signal terminal S1 therebetween, which is beneficial to increase the shielding area and improve the shielding effect.

In the illustrated embodiment of the present disclosure, the first connection portions 223 of the first conductive terminals 22 are insert-molded with the insulating bracket 21. Each first connection portion 223 of the first signal terminal S1 includes a narrowed portion 2230 embedded in the insulating bracket 21 to adjust the impedance of the first signal terminal S1, thereby achieving impedance matching. In the illustrated embodiment of the present disclosure, the first connection portion 223 of the first conductive terminal 22 is relatively long (for example, the first connection portion 223 of the first signal terminal S1 is thin and long). The present disclosure increases the strength of the first conductive terminals 22 by providing the reinforcing wall 215, and the first connection portions 223 of the first conductive terminals 22 are insert-molded with the reinforcing wall 215, so that the first conductive terminals 22 are not easy to bend. In the illustrated embodiment of the present disclosure, the first mating portion 221 of the first signal terminal S1 is substantially needle-shaped. The first mating portions 221 of the first ground terminal G1 and the second ground terminal G2 are substantially flat. The first mating portion 221 of the first signal terminal S1 and the first connection portion 223 of the first conductive terminal 22 are both coplanar, that is, located in a first plane (for example, a vertical plane). It should be noted that the technical term "coplanar" used in the present disclosure is intended to indicate that the related components are substantially flush, including incomplete coplanarity due to manufacturing tolerances. Besides, in the illustrated embodiment of the present disclosure, the first connection portion 223 of the first ground terminal G1 includes a first torsion portion 2231 connected to the first mating portion 221 of the first ground terminal G1, so that the first mating portion 221 of the first ground terminal G1 is located in a second plane (for example, a horizontal plane) perpendicular to the first plane. The first connection portion 223 of the second ground terminal G2 includes a second torsion portion 2232 connected to the first mating portion 221 of the second ground terminal G2, so that the first mating portion 221 of the second ground terminal G2 is located in a second plane (for example a horizontal plane) perpendicular to the first plane. The first mating portion 221 of the first ground terminal G1 and the first mating portion 221 of the second ground terminal G2 are parallel to each other.

Figure 19:
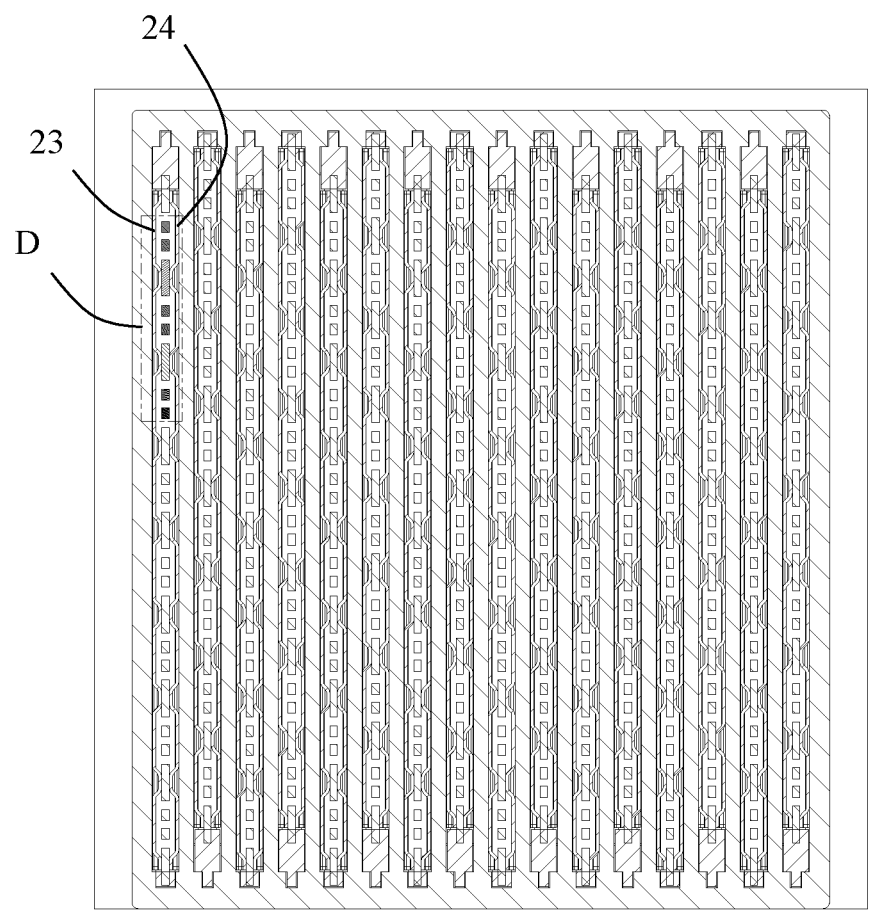
FIG. 19 is a schematic cross-sectional view taken along line B-B in FIG. 4.
Figure 20:
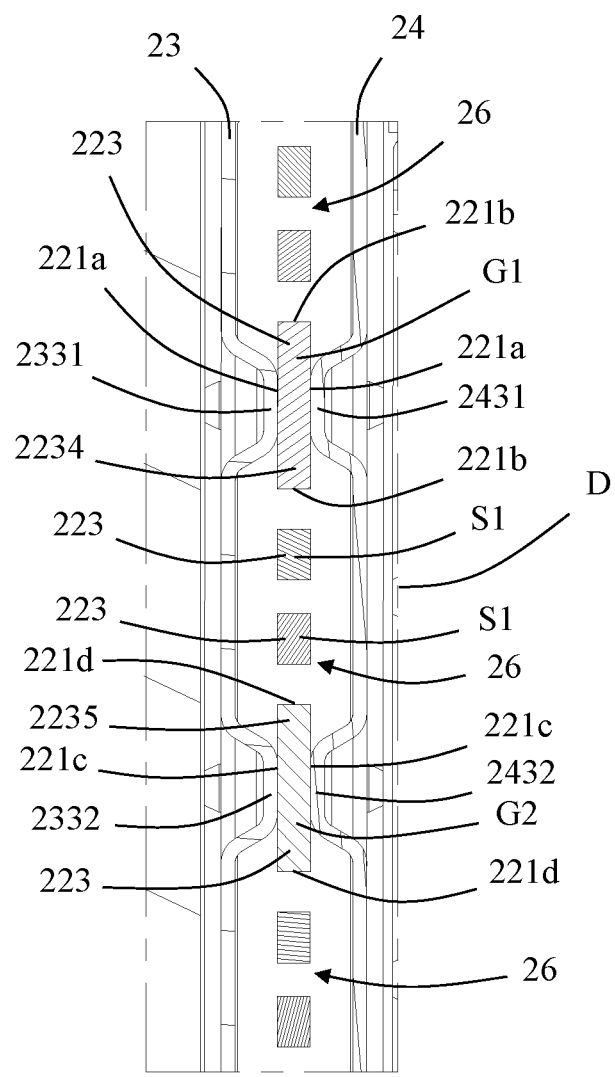
FIG. 20 is a partial enlarged view of a frame portion D in FIG. 19.
Figure 21:
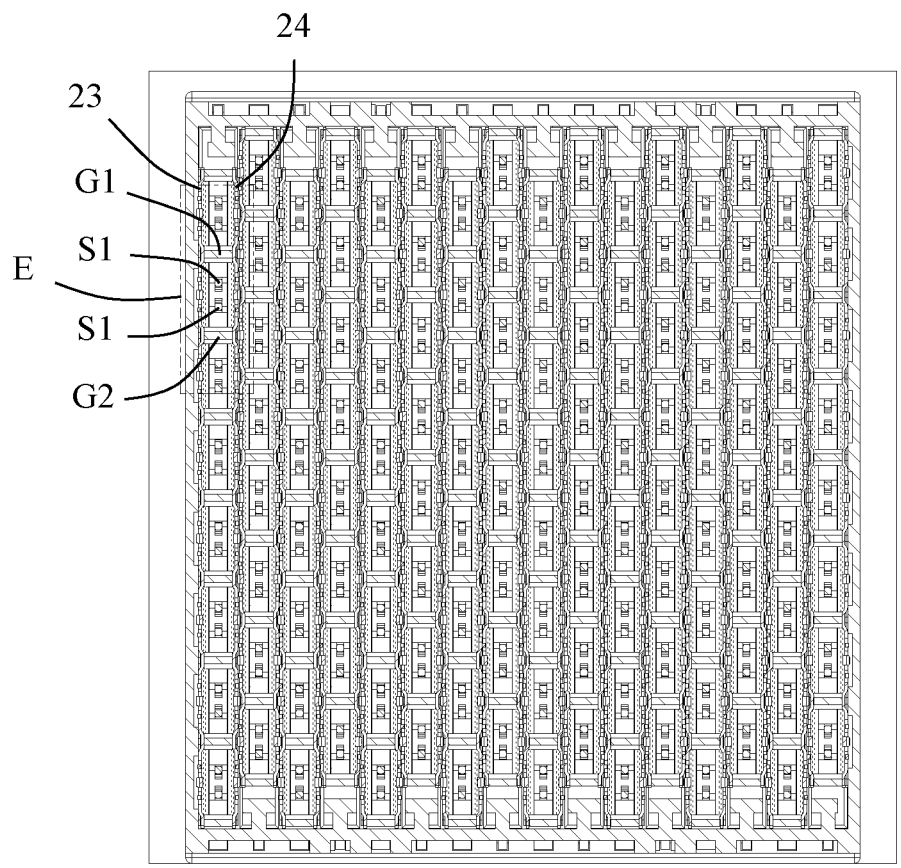
FIG. 21 is a schematic cross-sectional view taken along line C-C in FIG. 4.

Referring to FIGS. 19 and 20 in the illustrated embodiment of the present disclosure, the first contact portion 221 and the first connection portion 223 of the first ground terminal G1 have a first wide surface 221a and a first narrow surface 221b perpendicular to the first wide surface 221a. The first contact portion 221 and the first connection portion 223 of the second ground terminal G2 have a second wide surface 221c and a second narrow surface 221d perpendicular to the second wide surface 221c. The first connection portions 223 of each pair of first differential signal terminals are located between the first narrow surface 221b of the first ground terminal G1 and the second narrow surface 221d of the second ground terminal G2 which are located on opposite sides of the first connection portions 223 of each pair of first differential signal terminals (referring to FIG. 20). The first contact portions 221 of each pair of first differential signal terminals are located between the first wide surface 221a of the first ground terminal G1 and the second wide surface 221c of the second ground terminal G2 which are located on opposite sides of the first contact portions 221 of each pair of first differential signal terminals (referring to FIG. 22). In the illustrated embodiment of the present disclosure, a width of the first wide surface 221a and a width of the second wide surface 221c are greater than a width of each first contact portion 221 of the first signal terminals S1, thereby better shielding can be provided for the first contact portions 221 of the first signal terminals S1.

Figure 16:
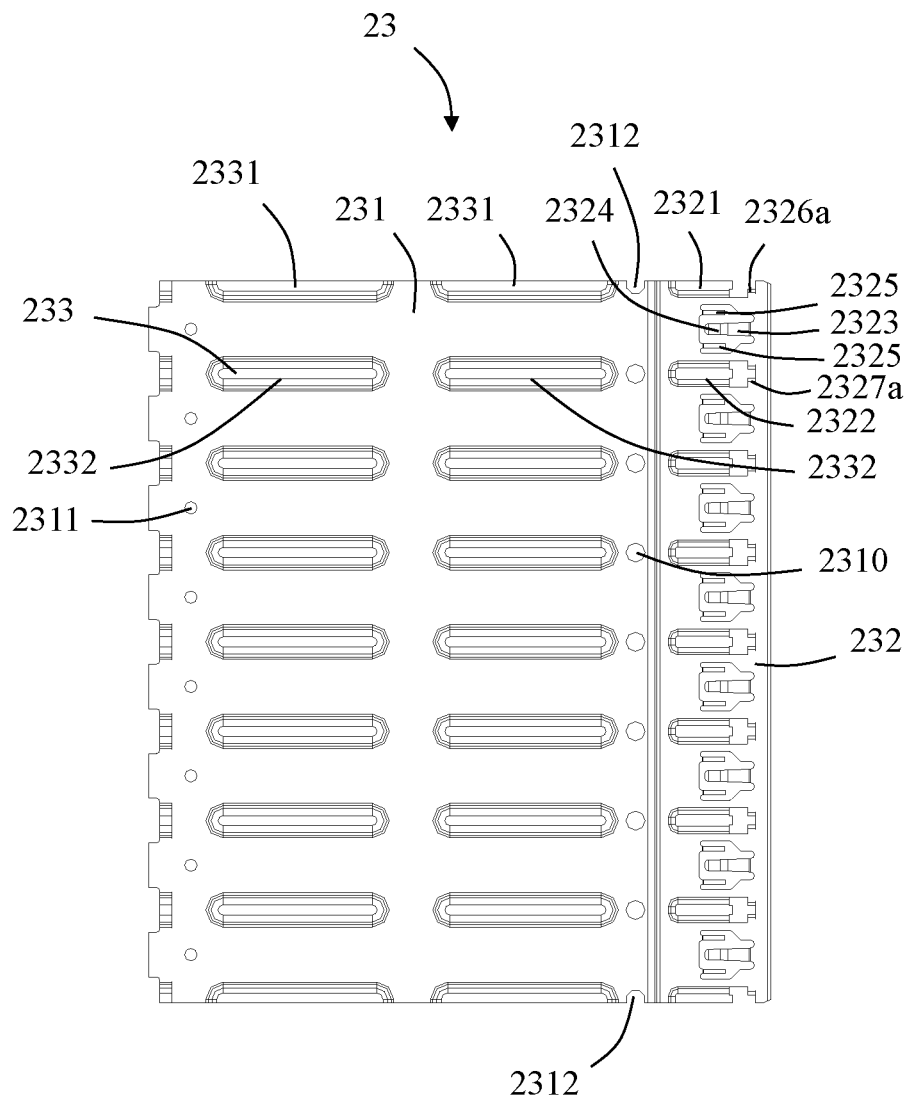
FIG. 16 is a front view of the first metal shield in FIG. 14.

In the illustrated embodiment of the present disclosure, the first metal shield 23 and the second metal shield 24 are symmetrically disposed on opposite sides of the insulating bracket 21. Referring to FIGS. 14 to 16, the first metal shield 23 includes a first main body portion 231 and a first extension portion 232 extending from the first main body portion 231. The first main body portion 231 is located on one side of the first connection portions 223 of the first conductive terminals 22. The first extension portion 232 is located on one side of the first contact portions 221 of the first conductive terminals 22. In the illustrated embodiment of the present disclosure, the first extension portion 232 and the first main body portion 231 are located in different planes, in which the first extension portion 232 is farther away from the second metal shield 24 than the first main body portion 231. The first main body portion 231 includes a plurality of first mounting holes 2311 for mating with the plurality of first posts 2161 and a plurality of third mounting holes 2310 for mating with the plurality of third posts 2163. The first posts 2161 are fixed and positioned in the first mounting holes 2311 by soldering and the third posts 2163 are fixed and positioned in the third mounting holes 2310 by soldering, thereby the fixing and positioning of the first metal shield 23 and the insulating bracket 21 are realized. The first main body 231 includes a plurality of ribs 233. The ribs 233 include a plurality of first ribs 2331 protruding toward the first ground terminals G1 and a plurality of second ribs 2332 protruding toward the second ground terminals G2. The first ribs 2331 corresponding to the first ground terminal G1 are disposed along an extending direction of the first connection portion 223 of the first ground terminal G1. The second ribs 2332 corresponding to the second ground terminal G2 are disposed along an extending direction of the first connection portion 223 of the second ground terminal G2. In the illustrated embodiment of the present disclosure, the first ribs 2331 and the second ribs 2332 are formed by stamping the first main body portion 231. The first ribs 2331 and the second ribs 2332 protrude toward the second metal shield 24. The first ribs 2331 and the second ribs 2332 are discontinuously disposed along the extending direction of the first connection portion 223 of the first ground terminal G1 and the extending direction of the first connection portion 223 of the second ground terminal G2, respectively, so as to achieve multi-position contact, thereby improving the reliability of the contact between the first metal shield 23 and the first ground terminals G1 and the second ground terminals G2. In the illustrated embodiment of the present disclosure, referring to FIG. 20, a wall thickness of the first rib 2331, a wall thickness of the second rib 2332, and a wall thickness of a portion of the first main body 231 located between the first rib 2331 and the second rib 2332 are the same. In addition, upper and lower edges of the first main body portion 231 further include a plurality of first positioning notches 2312 for mating with the insulating bracket 21.

The first extension portion 232 includes a plurality of first bulges 2321 protruding toward the corresponding first contact portions 221 of the first ground terminals G1, a plurality of second bulges 2322 protruding toward the corresponding first contact portions 221 of the second ground terminals G2, and a plurality of first elastic pieces 2323 each of which is located between adjacent first bulge 2321 and second bulge 2322. The first elastic pieces 2323 extend along directions toward the first main body portion 231. Each first elastic piece 2323 has an arc-shaped contact portion 2324. In the illustrated embodiment of the present disclosure, the first extension portion 232 further includes two first protruding tabs 2325 located at opposite sides of each first elastic piece 2323. The first protruding tabs 2325 and the first elastic pieces 2323 extend along opposite directions. The first protruding tabs 2325 protrude sidewardly to contact the adjacent first terminal module 2 so as to improve the shielding effect. In the illustrated embodiment of the present disclosure, referring to FIG. 22, a wall thickness of the first bulge 2321, a wall thickness of the second bulge 2322 and a wall thickness of a portion of the first extension portion 232 located between the first bulge 2321 and the second bulge 2322 are the same. In addition, the first extension portion 232 further includes a plurality of first abutting blocks 2326a and a plurality of second abutting blocks 2327a. Corresponding to one first ground terminal G1 and one second ground terminal G2, the number of first abutting block 2326a and the second abutting block 2327a may be one or two. The first abutting block 2326a and the second abutting block 2327a are used to abut against or clamp the mating portion 221 of the corresponding first ground terminal G1 and the mating portion 221 of the corresponding second ground terminal G2 in the vertical direction, respectively, so as to realize position restriction.

Figure 17:
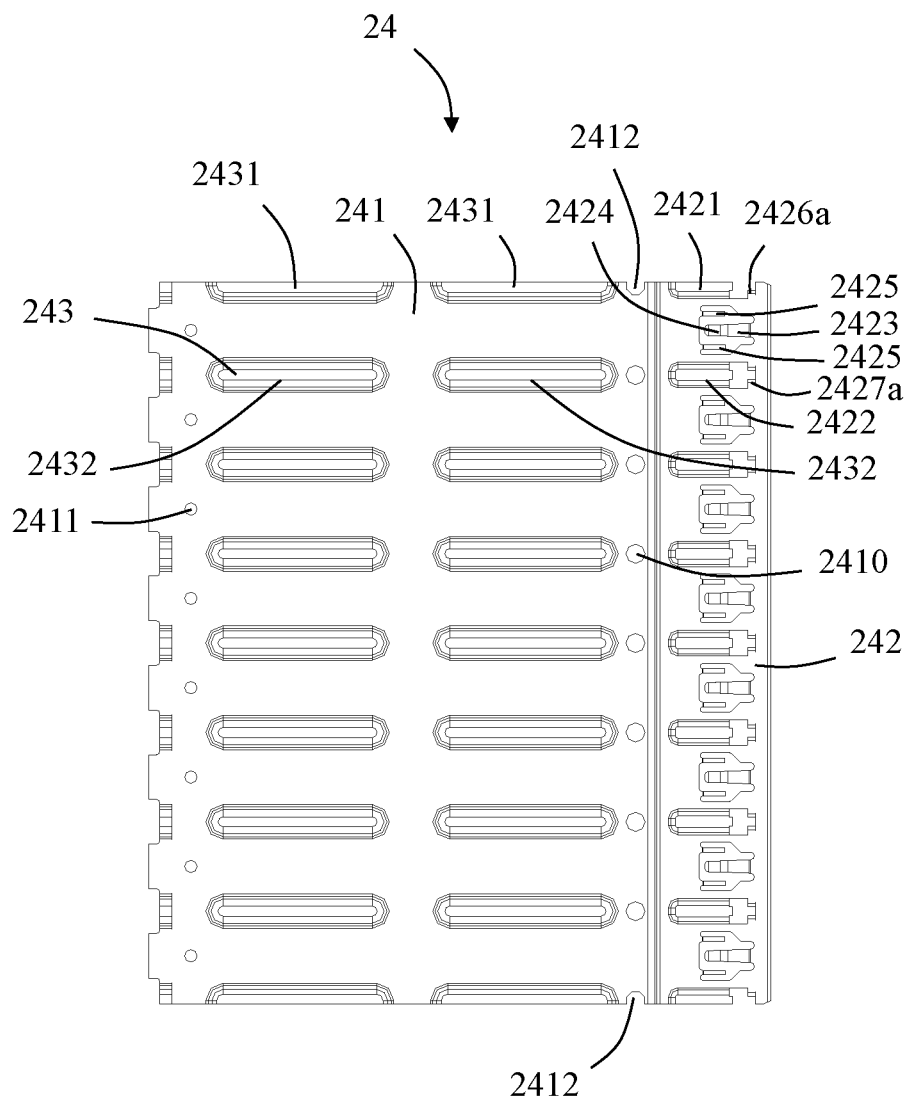
FIG. 17 is a front view of the second metal shield in FIG. 14.

Similarly, referring to FIGS. 14, 15 and 17, the second metal shield 24 includes a second main body portion 241 and a second extension portion 242 extending from the second main body portion 241. The second main body portion 241 is located on the other side of the first connection portions 223 of the first conductive terminals 22. The second extension portion 242 is located on the other side of the first contact portions 221 of the first conductive terminals 22. In the illustrated embodiment of the present disclosure, the second extension portion 242 and the second main body portion 241 are located in different planes, in which the second extension portion 242 is farther away from the first metal shield 23 than the second main body portion 241. The second main body portion 241 includes a plurality of second mounting holes 2411 for mating with the plurality of second posts 2162 and a plurality of fourth mounting holes 2410 for mating with the plurality of fourth posts 2164. The second posts 2162 are fixed and positioned in the second mounting holes 2411 by soldering and the fourth posts 2164 are fixed and positioned in the fourth mounting holes 2410 by soldering, so as to realize the fixing and positioning of the second metal shield 24 and the insulating bracket 21. The second main body 241 includes a plurality of ribs 243. The ribs 243 include a plurality of third ribs 2431 protruding toward the first ground terminals G1 and a plurality of fourth ribs 2432 protruding toward the second ground terminals G2. The third ribs 2431 are disposed along the extending direction of the first connection portion 223 of the first ground terminal G1. The fourth ribs 2432 are disposed along the extending direction of the first connection portion 223 of the second ground terminal G2. In the illustrated embodiment of the present disclosure, the third ribs 2431 and the fourth ribs 2432 are formed by stamping the second main body portion 241. The third ribs 2431 and the fourth ribs 2432 protrude toward the first metal shield 23. The third ribs 2431 and the fourth ribs 2432 are discontinuously disposed along the extending direction of the first connection portion 223 of the first ground terminal G1 and the extending direction of the first connection portion 223 of the second ground terminal G2, respectively, so as to achieve multi-position contact. As a result, the reliability of the contact between the second metal shield 24 and the first ground terminals G1 and the second ground terminals G2 is improved. In the illustrated embodiment of the present disclosure, a wall thickness of the third rib 2431, a wall thickness of the fourth rib 2432 and a wall thickness of a portion of the second main body 241 located between the third rib 2431 and the fourth rib 2432 are the same. In an embodiment of the present disclosure, soldering is performed on the surfaces of the ribs 233 and the ribs 243 to solder the ribs 233 and the ribs 243 to the first ground terminals G1 and the second ground terminals G2. For example, soldering is performed on the surfaces of the first ribs 2331, the second ribs 2332, the third ribs 2431 and the fourth ribs 2432 in order to solder the first ribs 2331, the second ribs 2332, the third ribs 2431 and the fourth rib 2432 to the first ground terminals G1 and the second ground terminals G2. The soldering method is at least one of spot soldering, laser soldering and ultrasonic soldering. In addition, upper and lower edges of the second main body portion 241 further include a plurality of second positioning notches 2412 for mating with the insulating bracket 21.

The second extension portion 242 includes a plurality of third bulges 2421 protruding toward the first contact portions 221 of the first ground terminals G1, a plurality of fourth bulges 2422 protruding toward the first contact portions 221 of the second ground terminals G2, and a plurality of second elastic pieces 2423 each of which is located between adjacent third bulge 2421 and fourth bulge 2422. The second elastic pieces 2423 extend along directions toward the second main body portion 241. Each second elastic piece 2423 has an arc-shaped contact portion 2424. In the illustrated embodiment of the present disclosure, the second extension portion 242 further includes two second protruding tabs 2425 located at opposite sides of each second elastic piece 2423. The second protruding tabs 2425 and the second elastic pieces 2423 extend along opposite directions. The second protruding tabs 2425 protrude sidewardly to contact the adjacent first terminal module 2 so as to improve the shielding effect. In the illustrated embodiment of the present disclosure, a wall thickness of the third bulge 2421, a wall thickness of the fourth bulge 2422, and a wall thickness of a portion of the second extension portion 242 located between the third bulge 2421 and the fourth bulge 2422 are the same. In addition, the second extension portion 242 further includes a plurality of third abutting blocks 2426a and a plurality of fourth abutting blocks 2427a. Corresponding to one first ground terminal G1 and one second ground terminal G2, the number of the third abutting block 2426a and the fourth abutting block 2427a may be one or two. The third abutting block 2426a and the fourth abutting block 2427a are used to abut against or clamp the mating portion 221 of the corresponding first ground terminal G1 and the mating portion 221 of the corresponding second ground terminal G2 in the vertical direction, respectively, so as to realize position restriction.

Referring to FIG. 20, along a length of the first connection portion 223 of the first conductive terminal 22, the first rib 2331 of the first metal shield 23 and the third rib 2431 of the second metal shield 24 respectively contact two opposite sides of the first connection portion 223 of the first ground terminal G1, and the second rib 2332 of the first metal shield 23 and the fourth rib 2432 of the second metal shield 24 respectively contact two opposite sides of the first connection portion 223 of the second ground terminal G2, thereby forming a shielding cavity 26 surrounding the outer periphery of the first connection portions 223 of each pair of first differential signal terminals. In the illustrated embodiment of the present disclosure, the first rib 2331 and the third rib 2431 respectively contact the first wide surface 221a of the first connection portion 223 of the first ground terminal G1. The second rib 2332 and the fourth rib 2432 respectively contact the second wide surface 221c of the first connection portion 223 of the second ground terminal G2. In the illustrated embodiment of the present disclosure, the shielding cavity 26 is jointly formed by the first main body portion 231, the second main body portion 241, the first ground terminal G1 and the second ground terminal G2. The first connection portion 223 of the first ground terminal G1 includes a first tab portion 2234 protruding into the shielding cavity 26. The first connection portion 223 of the second ground terminal G2 includes a second tab portion 2235 protruding into the shielding cavity 26. The first connection portions 223 of the first differential signal terminals are located between the first tab portion 2234 and the second tab portion 2235. In the illustrated embodiment of the present disclosure, there are a plurality of the shielding cavities 26 which are disposed along an arrangement direction of each group of the first conductive terminals 22. Two adjacent shielding cavities 26 share a single first ground terminal G1 or a single second ground terminal G2. In addition, a part of the shared first ground terminal G1 protrudes into one shielding cavity 26, and another part of the shared first ground terminal G1 protrudes into another shielding cavity 26.

Figure 22:
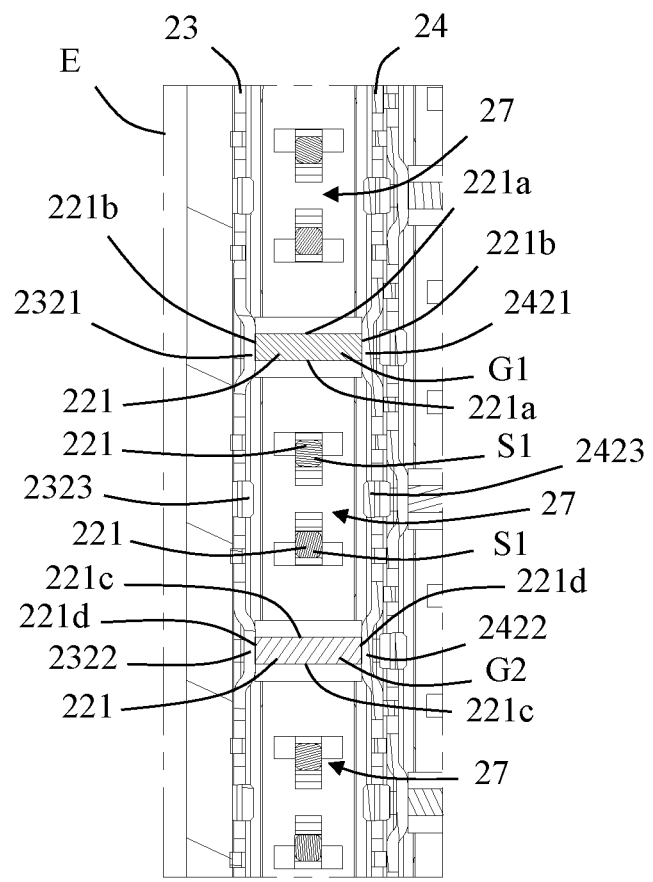
FIG. 22 is a partial enlarged view of a frame portion E in FIG. 21.

Referring to FIG. 22, in the length of the first contact portion 221 of the first conductive terminal 22, the first bulge 2321 of the first metal shield 23 and the third bulge 2421 of the second metal shield 24 respectively contact two opposite side surfaces of the first contact portion 221 of the first ground terminal G1, and the second bulge 2322 of the first metal shield 23 and the fourth bulge 2422 of the second metal shield 24 respectively contact two opposite side surfaces of the first contact portion 221 of the second ground terminal G2. In the illustrated embodiment of the present disclosure, the first bulge 2321 of the first metal shield 23 and the third bulge 2421 of the second metal shield 24 respectively contact the first narrow surfaces 221b of the first contact portion 221 of the first ground terminal G1. The second bulge 2322 of the first metal shield 23 and the fourth bulge 2422 of the second metal shield 24 respectively contact the second narrow surfaces 221d of the first contact portion 221 of the second ground terminal G2. The first extension portion 232, the second extension portion 242, the first ground terminal G1 and the second ground terminal G2 jointly form a shielding space 27 for accommodating the corresponding first contact portions 221 of the first differential signal terminals. The first elastic piece 2323 and the second elastic piece 2423 extend into the shielding space 27. In the illustrated embodiment of the present disclosure, there are multiple shielding spaces 27 which are disposed along a stacking direction of each group of the first conductive terminals 22. Two adjacent shielding spaces 27 share a single first ground terminal G1 or a single second ground terminal G2. One first wide surface 221a of the first contact portion 221 of the shared first ground terminal G1 is exposed to the shielding space 27, and the other first wide surface 221a of the first contact portion 221 of the shared first ground terminal G1 is exposed to an adjacent shielding space 27. Similarly, a first wide surface 221c of the first contact portion 221 of the shared second ground terminal G2 is exposed to the adjacent shielding space 27, and the other wide surface 221c of the first contact portion 221 of the shared second ground terminal G2 is exposed to another adjacent shielding space 27.

In the illustrated embodiment of the present disclosure, there are multiple first terminal modules 2 of the first backplane connector 100, and the terminal arrangement of two adjacent first terminal modules 2 are staggered. Correspondingly, the shielding cavities 26 at the same position of two adjacent first terminal modules 2 are staggered, and the shielding spaces 27 at the same position of two adjacent first terminal modules 2 are staggered.

Figure 23:
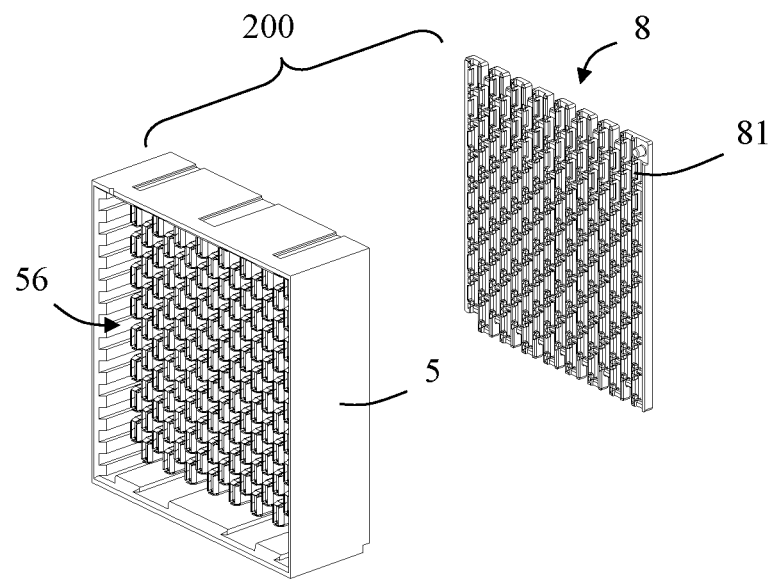
FIG. 23 is a partial perspective exploded view of the second backplane connector.
Figure 24:
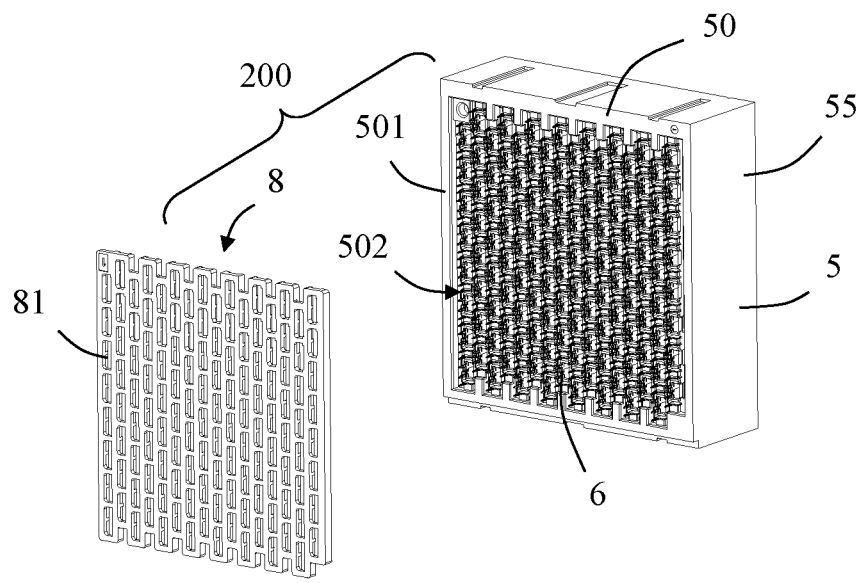
FIG. 24 is a partially exploded perspective view of FIG. 23 from another angle.
Figure 25:
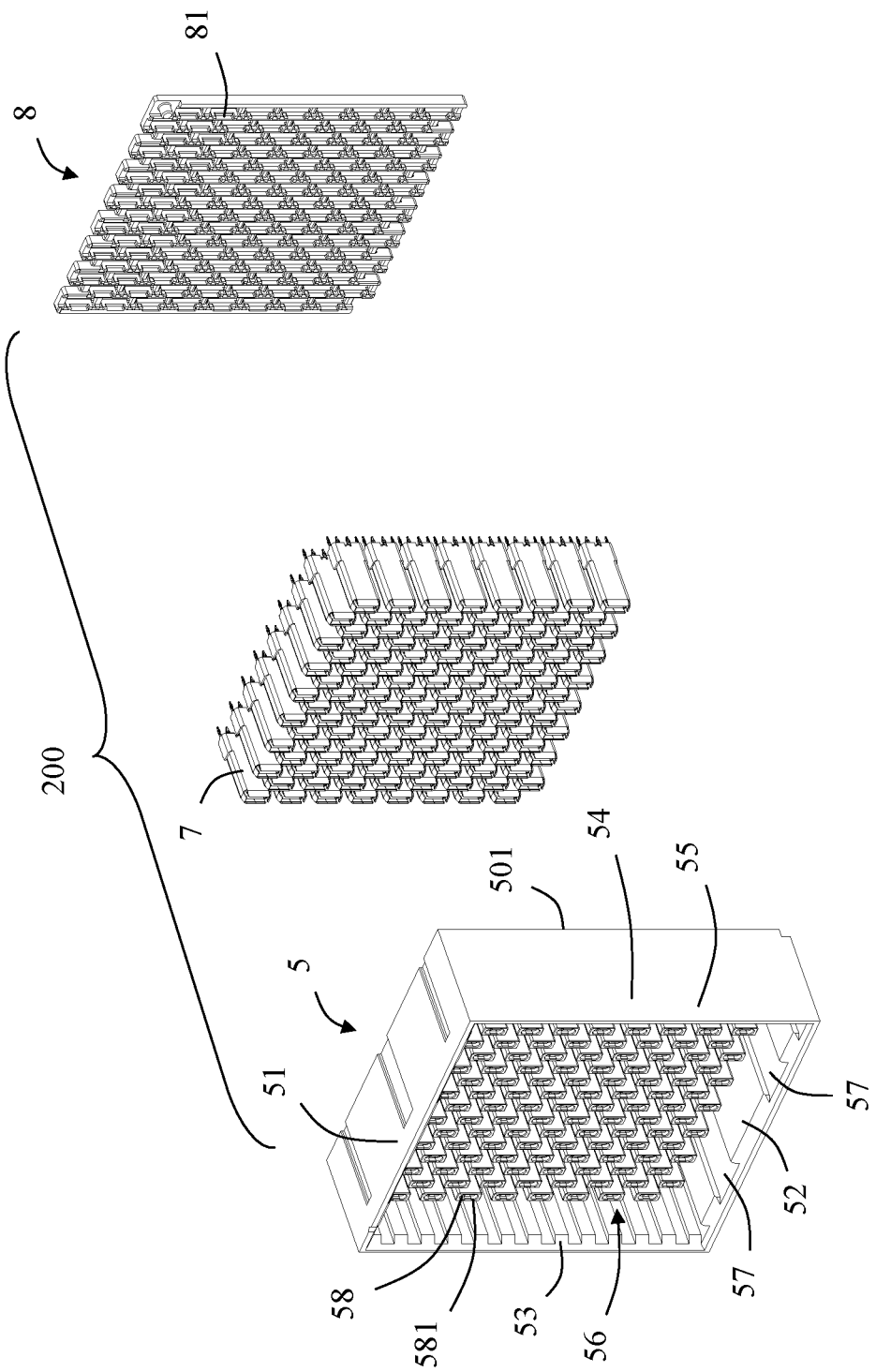
FIG. 25 is a further perspective exploded view of FIG. 23.
Figure 26:
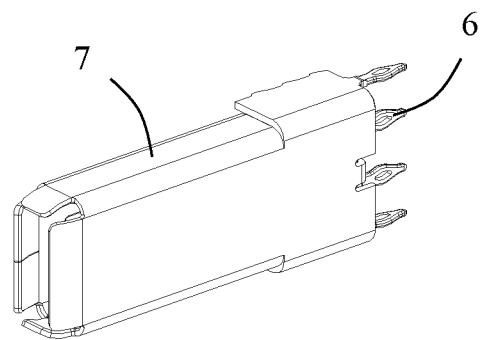
FIG. 26 is a perspective schematic view of the mutual positional relationship between a metal shield surrounding member and a second terminal module after assembly.

Referring to FIGS. 23 to 25, the second backplane connector 200 includes a second housing 5, a plurality of second terminal modules 6 mounted to the second housing 5, a plurality of metal shield surrounding members 7 fixed to the second housing 5 and located outside the corresponding second terminal modules 6, and a second mounting block 8 mounted to the second housing 5.

The second housing 5 is made of insulating material. The second housing 5 includes a base 50 and an enclosed wall portion 55 extending backwardly from the base 50. The wall portion 55 includes a first side wall 51, a second side wall 52 disposed opposite to the first side wall 51, a third side wall 53 connecting one side of the first side wall 51 and one side of the second side wall 52, and a fourth side wall 54 connecting the other side of the first side wall 51 and the other side of the second side wall 52. The base 50 and the wall portion 55 jointly form a receiving space 56 for receiving a portion of the first backplane connector 100.

The first side wall 51 and the second side wall 52 respectively include a plurality of positioning grooves 57 for mating with the positioning protrusions 14 of the first backplane connector 100. In addition, the base 50 further includes a second mounting surface 501 and a second mounting space 502 recessed backwardly from the second mounting surface 501. The second mounting space 502 is used to install the second mounting block 8.

In the illustrated embodiment of the present disclosure, the second housing 5 further includes a plurality of insulating protrusions 58 integrally extending from the base 50 and disposed at intervals. The plurality of insulating protrusions 58 extend backwardly into the receiving space 56. The plurality of insulating protrusions 58 are disposed in multiple rows along the left-right direction. The insulating protrusions 58 in two adjacent rows are arranged in a staggered manner. That is, the insulating protrusions 58 located at the same position in two adjacent rows are not in alignment with each other in the left-right direction. Each insulating protrusion 58 includes a plurality of receiving holes 581 for at least partially receiving the second terminal modules 6.

Referring to FIGS. 26 to 29, in the illustrated embodiment of the present disclosure, each metal shield surrounding member 7 is formed by stamping, bending and riveting a metal plate. The metal shield surrounding member 7 includes a hollow portion 71, a mounting portion 72 extending forwardly from the hollow portion 71, and a plurality of mounting feet 73 extending forwardly from the mounting portion 72. The hollow portion 71 includes a first side wall 711, a second side wall 712, a third side wall 713 and a fourth side wall 714. The first side wall 711, the second side wall 712, the third side wall 713 and the fourth side wall 714 are sequentially connected. The first side wall 711 is opposite to the third side wall 713, and the second side wall 712 is opposite to the fourth side wall 714, thereby forming an enclosed shielding cavity. Of course, in other embodiments, the shielding cavity may also be of a non-enclosed type. For example, the hollow portion 71 includes a second side wall 712, a third side wall 713 and a fourth side wall 714 which are sequentially connected. As a result, the hollow portion 71 is substantially U-shaped. In the illustrated embodiment of the present disclosure, areas of the first side wall 711 and the third side wall 713 are larger than areas of the second side wall 712 and the fourth side wall 714. Each end of the first side wall 711, the second side wall 712, the third side wall 713 and the fourth side wall 714 includes a deflection portion 715 which is bent inwardly. The deflection portions 715 are independent from one another so that they can be bent independently in order to avoid mutual interference. By providing the deflection portions 715, a constriction opening can be formed at the end of the metal shield surrounding member 7, which is easy to guide the deflection portions 715 from being easily inserted into the first backplane connector 100.

In the illustrated embodiment of the present disclosure, the mounting portion 72 is substantially U-shaped. The mounting portion 72 includes a connecting portion 720, a first bending portion 721 bent from one side of the connecting portion 720 and a second bending portion 722 bent from the other side of the connecting portion 720. The connecting portion 720 is coplanar with the third side wall 713. The first bending portion 721 and the second side wall 712 are located on the same side. The first bending portion 721 protrudes outwardly (for example, upwardly) from the second side wall 712. The second bending portion 722 and the fourth side wall 714 are located on the same side. The second bent portion 722 protrudes outwardly (for example, downwardly) from the fourth side wall 714. The mounting portion 72 further includes a bottom retaining portion 726 located at the connecting portion 720. In the illustrated embodiment of the present disclosure, when the metal shield surrounding member 7 is not installed on the insulating protrusion 58, the retaining portion 726 and the connecting portion 720 are located in the same plane. After the metal shield surrounding member 7 is installed on the insulating protrusion 58, the retaining portion 726 is bent inwardly (that is, in a direction toward the wall portion 55) so that the retaining portion 726 is perpendicular to the connecting portion 720. The retaining portion 726 is located at a front middle end of the connecting portion 720.

Figure 27:
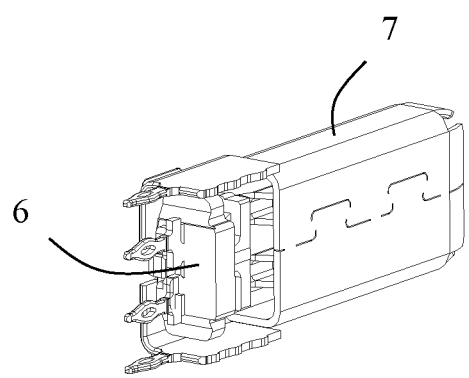
FIG. 27 is a perspective schematic view of FIG. 26 from another angle.
Figure 28:
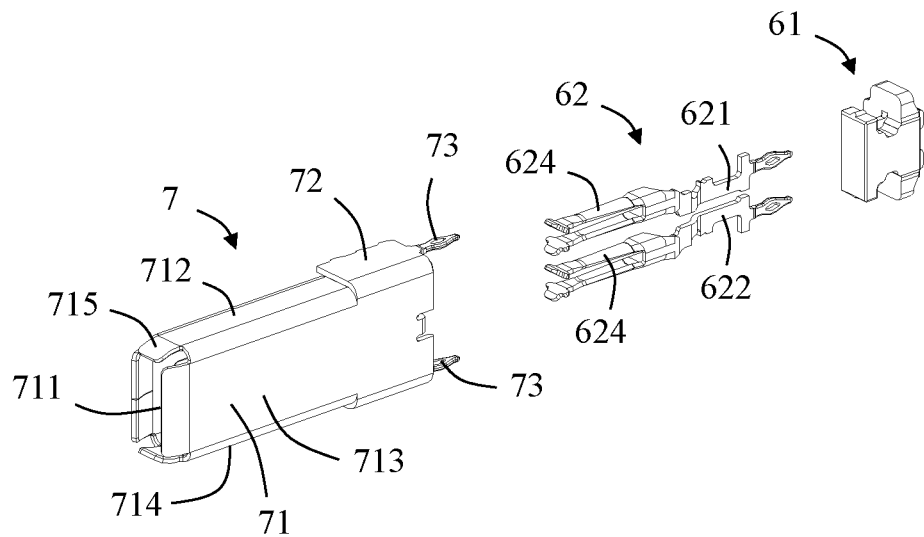
FIG. 28 is a perspective exploded view of FIG. 26.
Figure 29:
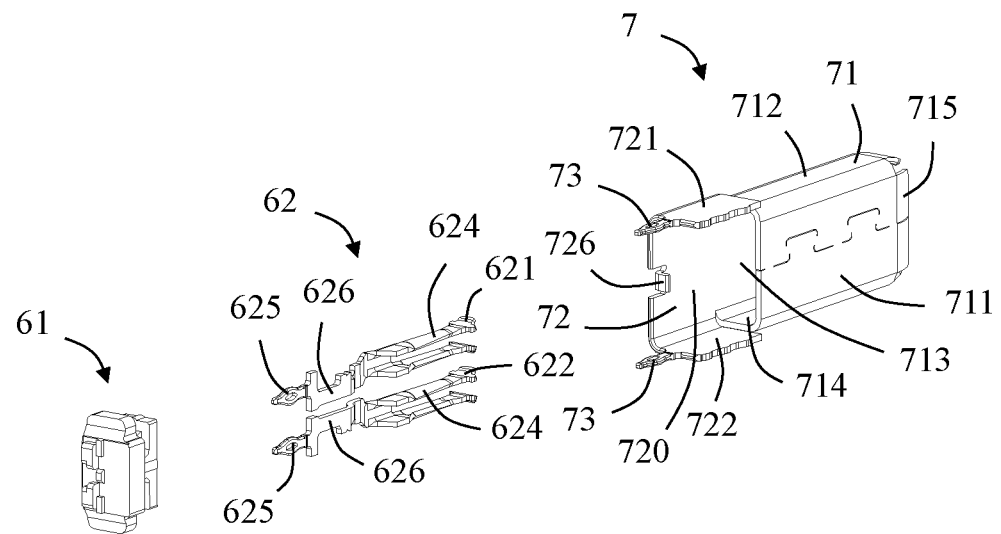
FIG. 29 is a perspective exploded view of FIG. 28 from another angle.

Referring to FIGS. 27 to 29, each second terminal module 6 includes an insulating block 61 and a plurality of second conductive terminals 62 fixed to the insulating block 61. In an embodiment of the present disclosure, the second conductive terminals 62 are insert-molded with the insulating block 61. The second conductive terminals 62 include a first signal terminal 621 and a second signal terminal 622. In an embodiment of the present disclosure, for each second terminal module 6, the first signal terminal 621 and the second signal terminal 622 form a pair of second differential signal terminals. In the illustrated embodiment of the present disclosure, the first signal terminal 621 and the second signal terminal 622 are symmetrically disposed along a central axis of the insulating block 61.

Figure 30:
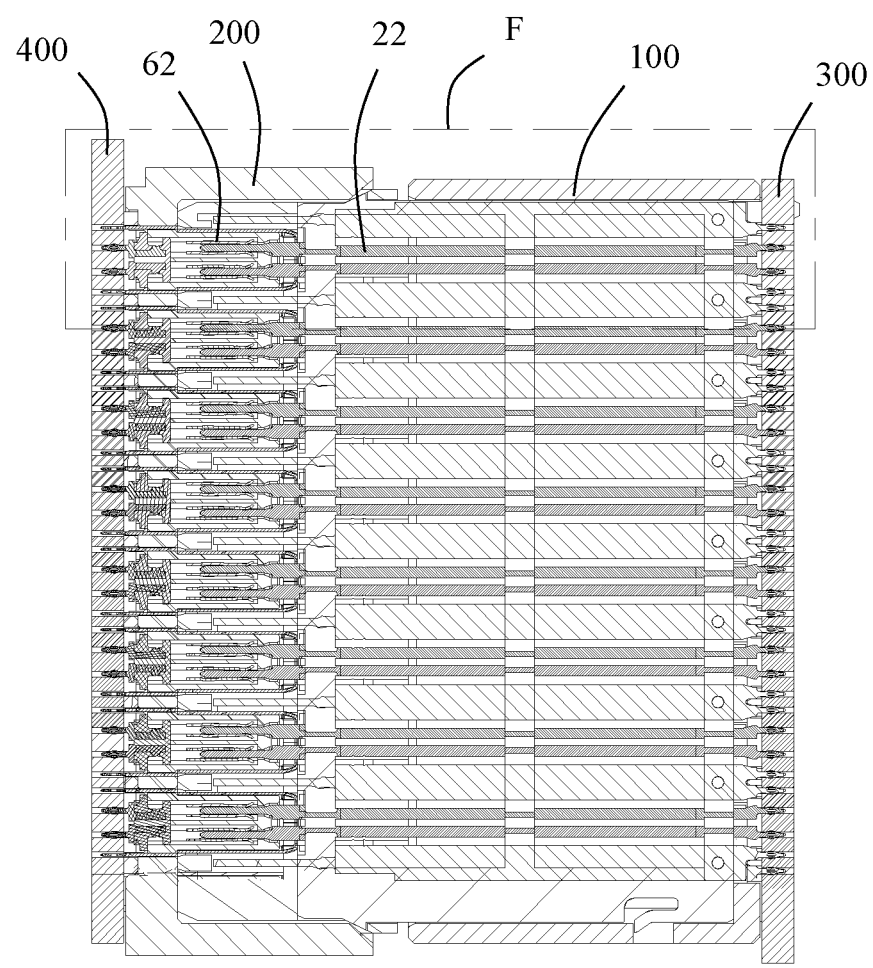
FIG. 30 is a schematic cross-sectional view taken along line A-A in FIG. 1.
Figure 31:
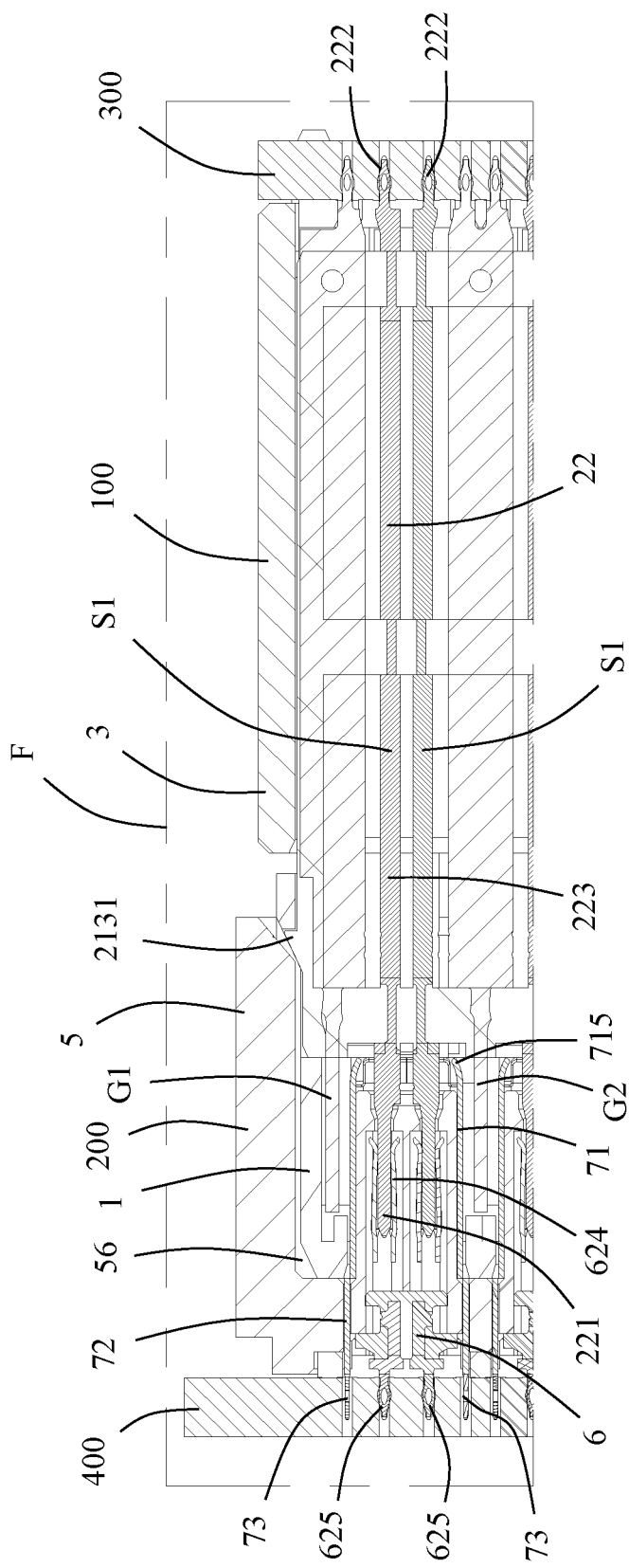
FIG. 31 is a partial enlarged view of a frame portion F in FIG. 30.

From a structural point of view, the second conductive terminal 62 includes a contact arm 624, a second tail portion 625, and a second connecting portion 626 connecting the contact arm 624 and the second tail portion 625. The second connecting portion 626 is fixed to the insulating block 61. The contact arm 624 extends backwardly beyond the insulating block 61 to be electrically connected with the first backplane connector 100. The second tail portion 625 extends forwardly beyond the insulating block 61 so as to be electrically connected to the second circuit board 400. In an embodiment of the present disclosure, the second mounting block 8 is made of electroplated plastic or conductive plastic in order to improve the shielding effect. Referring to FIGS. 24, 30 and 31, the second mounting block 8 includes a plurality of positioning holes 81. The second tail portions 625 and the mounting feet 73 extend through the positioning holes 81 to be mounted on the second circuit board 400. This arrangement helps to ensure the distance between the second tail portions 625 and the mounting feet 73, so as to facilitate mounting the second tail portions 625 and the mounting feet 73 to the second circuit board 400. In the illustrated embodiment of the present disclosure, the second conductive terminal 62 has a substantially straight strip shape and extends along the front-rear direction.

When assembling, firstly, the plurality of metal shield surrounding members 7 are sleeved on the insulating protrusions 58 along the rear-to-front direction, so that the hollow portions 71 are wrapped around the insulating protrusions 58. The plurality of second terminal modules 6 are inserted into the corresponding receiving holes 581 along the front-to-rear direction. Then, the retaining portions 726 are bent inwardly to abut against the insulating blocks 61. With this arrangement, on the one hand, the metal shield surrounding members 7 can be prevented from being separated from the insulating protrusions 58 backwardly; and on the other hand, the second terminal modules 6 can be prevented from being separated from the second housing 5 forwardly. Finally, the second mounting block 8 is mounted to the second mounting space 502. The mounting feet 73 of the metal shield surrounding members 7 and the second tail portions 625 of the second conductive terminals 62 pass through the positioning holes 81 of the second mounting block 8 so as to be electrically connected to the second circuit board 400.

When the first backplane connector 100 is mated with the second backplane connector 200, the first housing 1 of the first backplane connector 100 is inserted into the receiving space 56 of the second housing 5 of the second backplane connector 200, the hollow portions 71 of the second terminal modules 6 of the second backplane connector 200 are inserted into the shielding spaces 27 of the first backplane connector 100 under the guidance of the deflection portions 715. The first differential signal terminals of the first backplane connector 100 are mating with the second differential signal terminals of the second backplane connector 200 to achieve electrical connection.

The above embodiments are only used to illustrate the present disclosure and not to limit the technical solutions described in the present disclosure. The understanding of this specification should be based on those skilled in the art. Descriptions of directions, such as "front", "back", "left", "right", "top" and "bottom", although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A backplane connector, comprising: a plurality of first terminal modules, each first terminal module comprising:
a plurality of first conductive terminals, each first conductive terminal comprising a first mating portion, a first tail portion and a first connection portion connecting the first mating portion and the first tail portion;

an insulating bracket fixed on the first connection portions of the first conductive terminals;
a first metal shield comprising a first extension portion; and
a second metal shield comprising a second extension portion;
wherein the first conductive terminals comprise first differential signal terminals, a first ground terminal and a second ground terminal, and wherein the first differential signal terminals are located between the first ground terminal and the second ground terminal;
wherein the first mating portion, the first connection portion and the first tail portion extend along a mating direction; and
wherein the first extension portion, the second extension portion, the first mating portion of the first ground terminal and the first mating portion of the second ground terminal are enclosed to form a shielding space in which the first mating portions of the first differential signal terminals are located.

2. The backplane connector according to claim 1, further comprising a first housing having a first body portion, a first wall portion extending from one end of the first body portion, and a second wall portion extending from the other end of the first body portion; the first wall portion comprising a plurality of first slots and a plurality of first locking grooves in communication with corresponding first slots; the second wall portion comprising a plurality of second slots and a plurality of second locking grooves in communication with corresponding second slots;
wherein the first slots and the second slots which are in communication with the first slots jointly form a plurality of installation slots, one parts of the first terminal modules are received in the installation slots, and the first locking grooves and the second locking grooves lock with one ends of the first terminal modules.

3. The backplane connector according to claim 2, further comprising a mounting housing provided separately from the first housing, the mounting housing comprising a first end surface adjacent to the first housing, a first mounting surface opposite to the first end surface and a plurality of receiving slots extending through the first end surface and the first mounting surface, the other parts of the first terminal modules are received in the receiving slots.

4. The backplane connector according to claim 3, wherein the mounting housing comprises a third wall portion having a plurality of third locking grooves in communication with the receiving slots, and the third locking grooves lock the other ends of the first terminal modules.

5. The backplane connector according to claim 4, wherein the insulating bracket comprises a first locking protrusion locked in a corresponding first locking groove, a second locking protrusion locked in a corresponding second locking groove, and a third locking protrusion locked in a corresponding third locking groove; and wherein the first locking protrusion, the second locking protrusion and the third locking protrusion are elastic protrusions or non-elastic protrusions.

6. The backplane connector according to claim 5, wherein the insulating bracket comprises a locking elastic arm on which the third locking protrusion is disposed, and inclination directions of the first locking protrusion and the third locking protrusion are opposite to each other.

7. The backplane connector according to claim 3, wherein the mounting housing comprises a first mounting space recessed from the first mounting surface toward the first end surface; and wherein the backplane connector comprises a first mounting block mounted in the first mounting space, and the first mounting block comprises a plurality of positioning holes through which the first tail portions pass.

8. The backplane connector according to claim 7, wherein the first mounting block is made of electroplated plastic or conductive plastic.

9. The backplane connector according to claim 1, wherein the insulating bracket comprises a first front wall, a first rear wall, a reinforcing wall located between the first front wall and the first rear wall in a front-rear direction, a first hollow portion located between the first front wall and the reinforcing wall, and a second hollow portion located between the reinforcing wall and the first rear wall; wherein the first connection portions are fixed to the first front wall, the reinforcing wall and the first rear wall; and wherein the first connection portions are partially exposed in the first hollow portion and the second hollow portion.

10. The backplane connector according to claim 1, wherein the first extension portion comprises a first bulge protruding toward the first ground terminal and a second bulge protruding toward the second ground terminal;
wherein the second extension portion comprises a third bulge protruding toward the first ground terminal and a fourth bulge protruding toward the second ground terminal; and
wherein the first bulge and the third bulge are in contact with opposite side surfaces of the first mating portion of the first ground terminal, respectively, and the second bulge and the fourth bulge are in contact with opposite side surfaces of the first mating portion of the second ground terminal respectively, so as to form the shielding space.

11. The backplane connector according to claim 10, wherein the first connection portions of the first differential signal terminals, the first connection portion of the first ground terminal, and the first connection portion of the second ground terminal are located in a first plane; the first ground terminal comprises a first torsion portion, the second ground terminal comprises a second torsion portion; and the first mating portion of the first ground terminal and the first mating portion of the second ground terminal are parallel and both perpendicular to the first plane.

12. The backplane connector according to claim 11, wherein the first mating portion of the first ground terminal comprises two first wide surfaces and two first narrow surfaces; the first mating portion of the second ground terminal comprises two second wide surfaces and two second narrow surfaces; the first bulge and the third bulge are in contact with the first narrow surfaces of the first ground terminal, respectively; and the second bulge and the fourth bulge are in contact with the second narrow surfaces of the second ground terminal, respectively.

* * * * *